(12) United States Patent
Qin et al.

(10) Patent No.: US 10,743,008 B2
(45) Date of Patent: Aug. 11, 2020

(54) VIDEO FILE TRANSCODING SYSTEM, SEGMENTATION METHOD, AND TRANSCODING METHOD AND APPARATUS

(71) Applicant: Tencent Technology (Shenzhen) Company Limited, Shenzhen (CN)

(72) Inventors: Zhi Qin, Shenzhen (CN); Qi Liu, Shenzhen (CN); Jianxiong Shi, Shenzhen (CN)

(73) Assignee: TENCENT TECHNOLOGY (SHENZHEN) COMPANY LIMITED, Shenzhen, Guangdong Province (CN)

( * ) Notice: Subject to any disclaimer, the term of this patent is extended or adjusted under 35 U.S.C. 154(b) by 0 days.

(21) Appl. No.: 16/518,802

(22) Filed: Jul. 22, 2019

(65) Prior Publication Data
US 2019/0364290 A1    Nov. 28, 2019

Related U.S. Application Data

(63) Continuation of application No. PCT/CN2018/088057, filed on May 23, 2018.

(30) Foreign Application Priority Data

Jun. 5, 2017  (CN) .......................... 2017 1 0411958

(51) Int. Cl.
  *H04N 19/40* (2014.01)
  *G06F 9/48* (2006.01)
  *H03M 7/30* (2006.01)

(52) U.S. Cl.
  CPC ............... *H04N 19/40* (2014.11); *G06F 9/48* (2013.01); *H03M 7/3064* (2013.01)

(58) Field of Classification Search
  CPC ...................................................... H04N 19/40
  (Continued)

(56) References Cited

U.S. PATENT DOCUMENTS

2006/0171463 A1* 8/2006 Hanamura ......... H04N 21/2662
                                                                375/240.13
2014/0129825 A1    5/2014 Losev et al.
(Continued)

FOREIGN PATENT DOCUMENTS

CN          101459848 A        6/2009
CN          102780918 A        11/2012
(Continued)

OTHER PUBLICATIONS

Tencent Technology, ISRWO, PCT/CN2018/088057, Aug. 17, 2018, 7 pgs.

(Continued)

*Primary Examiner* — Yulin Sun
(74) *Attorney, Agent, or Firm* — Morgan, Lewis & Bockius LLP

(57) ABSTRACT

This application a video file transcoding system and related transcoding method. The system includes: a segmentation device for obtaining a video file and a customized index parameter; split the video file into n video fragments; and generate transcoding configuration parameters according to the customized index parameter; a transcoding device for obtaining an $i^{th}$ video fragment; obtain a customized material corresponding to the $i^{th}$ video fragment according to the transcoding configuration parameters; add the customized material to the $i^{th}$ video fragment, to obtain an $i^{th}$ customized video fragment; and transcode the $i^{th}$ customized video fragment to obtain an $i^{th}$ target video fragment; and a merging device for merging n target video fragments into a target video file after n customized video fragments are all (Continued)

transcoded. This application resolves the problem that it takes too long to transcode a video file to which customized information needs to be added and/or transcoding efficiency is low.

18 Claims, 7 Drawing Sheets

(58) Field of Classification Search
USPC .................................................. 375/240.26
See application file for complete search history.

(56) References Cited

U.S. PATENT DOCUMENTS

2014/0289303 A1* 9/2014 Tarricone ............... H04L 67/10
709/201

2016/0248834 A1 8/2016 Richards et al.

FOREIGN PATENT DOCUMENTS

| | | |
|---|---|---|
| CN | 103200204 A | 7/2013 |
| CN | 103686203 A | 3/2014 |
| CN | 105357593 A | 2/2016 |
| CN | 105407381 A | 3/2016 |
| CN | 105407413 A | 3/2016 |
| CN | 105451031 A | 3/2016 |
| CN | 105898319 A | 8/2016 |
| EP | 2151971 A1 | 2/2010 |

OTHER PUBLICATIONS

Tencent Technology, IPRP, PCT/CN2018/088057, Dec. 10, 2019, 6 pgs.

* cited by examiner

VIDEO FILE TRANSCODING SYSTEM, SEGMENTATION METHOD, AND TRANSCODING METHOD AND APPARATUS

CROSS-REFERENCE TO RELATED APPLICATIONS

This application is a continuation application of PCT/CN2018/088057, entitled "VIDEO FILE TRANSCODING SYSTEM, SEGMENTATION METHOD, AND TRANSCODING METHOD AND APPARATUS" filed on May 23, 2018, which claims priority to China Patent Application No. 201710411958.3, filed with the Chinese Patent Office on Jun. 5, 2017 and entitled "VIDEO FILE TRANSCODING SYSTEM, SEGMENTATION METHOD, AND TRANSCODING METHOD AND APPARATUS", all of which are incorporated by reference in their entirety.

FIELD OF THE TECHNOLOGY

Embodiments of this application relate to the field of Internet technologies, and in particular, to a video file transcoding system, segmentation method, and transcoding method and apparatus.

BACKGROUND OF THE DISCLOSURE

A video file transcoding refers to a process in which a bit rate of a video source file is adjusted, so as to output video files with different definition. Because the video source file includes an extremely large amount of data, online video files on a video website are usually compressed and transcoded.

Before a video file is launched online, in addition to the bit rate adjustment, it is also possible to add some customized information to the video file, for example, add a watermark, opening credits, and closing credits. There are various types of customized information, and different types of customized information have different adding positions in the video file, different adding time points, and different adding manners. During adding of the customized information, corresponding customized information needs to be added to the complete video source file. Therefore, in the existing technology, when customized information is added to a video file, one transcoding device is usually used to add the customized information to a video source file, and then adjust a bit rate of the video source file added with the customized information.

In the related technology, the customized information is usually added by one transcoding device, while transcoding of the video file may be completed by one device, or may be processed by a plurality of devices simultaneously. When one device is used to add the customized information to the video file and transcode the video file, it takes a long time and transcoding efficiency is low. When a plurality of devices is used to transcode the video file, because only one device is used to add the customized information, an adding speed of the customized information falls behind a transcoding speed, a waiting time is long, and transcoding efficiency is low.

SUMMARY

Embodiments of this application provide a video file transcoding system, segmentation method, and transcoding method and apparatus, so as to resolve the problem that it takes a long time to transcode a video file to which customized information needs to be added and/or transcoding efficiency is low. The technical solutions are as follows:

According to a first aspect of the present disclosure, a video file transcoding system is provided. The system includes: a segmentation device, a transcoding device, and a merging device, the segmentation device being configured to obtain a video file and a customized index parameter of the video file; split the video file into n video fragments, n being a positive integer greater than 1; generate transcoding configuration parameters according to the customized index parameter, the customized index parameters being used for indicating identifiers of customized materials, and the transcoding configuration parameters being used for indicating detailed information of the customized materials and a relationship between the customized materials and the video fragments;

the transcoding device being configured to obtain an $i^{th}$ video fragment, the $i^{th}$ video fragment being any one of the n video fragments, and i being a positive integer greater than or equal to 1 and less than or equal to n; obtain a customized material corresponding to the $i^{th}$ video fragment according to the transcoding configuration parameters; add the obtained customized material to the $i^{th}$ video fragment, to obtain an $i^{th}$ customized video fragment; and transcode the $i^{th}$ customized video fragment to obtain an $i^{th}$ target video fragment; and the merging device being configured to merge the n target video fragments into a target video file after the n customized video fragments are all transcoded.

In some embodiments, the system further includes a task management device, where the segmentation device is configured to move the n video fragments to a download service path; generate first download addresses according to the download service path; and send identifiers of the video fragments and the first download addresses to the task management device;

the task management device is configured to generate an $i^{th}$ transcoding task according to an identifier of the $i^{th}$ video fragment, a first download address of the $i^{th}$ video fragment, and preset transcoding information, the transcoding information being used for indicating a transcoding bit rate corresponding to the video fragment; and the transcoding device is configured to obtain the $i^{th}$ transcoding task; obtain the first download address of the $i^{th}$ video fragment from the transcoding task; and download the $i^{th}$ video fragment according to the first download address.

In some embodiments, the transcoding device is configured to move, after obtaining the $i^{th}$ target video fragment, the target video fragment to a download service path; generate a second download address according to the download service path; and send an identifier of the target video fragment and the second download address to the task management device; and the task management device is configured to convert a task state of the $i^{th}$ transcoding task to be a completed state.

In some embodiments, the task management device is configured to generate a merging task according to identifiers of the n target video fragments and the n second download addresses after the n transcoding tasks are all completed, the n target video fragments in each merging task corresponding to the same bit rate;

the merging device is configured to obtain the merging task; obtain the second download addresses of the n target video fragments from the merging task; download the n target video fragments according to the second download addresses; merge the n target video fragments into the target video file according to the identifiers of the n target video fragments; and send state transition information to the task management device; and the task management device is configured to convert a task state of the merging task to be a completed state according to the state transition information.

In some embodiments, the system further includes a material device and a transcoding configuration device, where the segmentation device is configured to obtain a customized detail parameter from the material device according to the customized index parameter of the video file, the customized detail parameter being used for indicating the detailed information of the customized materials; generate the transcoding configuration parameters according to the video fragments and the customized detail parameter; and store the transcoding configuration parameters into the transcoding configuration device; and the transcoding device is configured to obtain, from the transcoding configuration device, a transcoding configuration parameter corresponding to the $i^{th}$ video fragment according to the $i^{th}$ video fragment; and obtain the customized material corresponding to the $i^{th}$ video fragment according to the transcoding configuration parameter.

In some embodiments, the transcoding device is configured to determine, according to a type of the obtained customized material, an adding manner corresponding to the type of the customized material; and add the customized material to the $i^{th}$ video fragment in the adding manner according to the transcoding configuration parameter, to obtain the $i^{th}$ customized video fragment.

According to a second aspect of the present disclosure, a video file transcoding method is performed by the foregoing video file transcoding system, and includes:

obtaining, by the segmentation device, a video file and a customized index parameter of the video file; splitting the video file into n video fragments, n being a positive integer greater than 1; generating transcoding configuration parameters according to the customized index parameter, the customized index parameters being used for indicating identifiers of customized materials, and the transcoding configuration parameters being used for indicating detailed information of the customized materials and a relationship between the customized materials and the video fragments;

obtaining, by the transcoding device, an $i^{th}$ video fragment, the $i^{th}$ video fragment being any one of the n video fragments, and i being a positive integer greater than or equal to 1 and less than or equal to n; obtaining a customized material corresponding to the $i^{th}$ video fragment according to the transcoding configuration parameters; adding the obtained customized material to the $i^{th}$ video fragment, to obtain an $i^{th}$ customized video fragment; and transcoding the $i^{th}$ customized video fragment to obtain an $i^{th}$ target video fragment; and merging, by the merging device, the n target video fragments into a target video file after the n customized video fragments are all transcoded.

In some embodiments, before the obtaining, by the transcoding device, an $i^{th}$ video fragment, the method further includes:

moving, by the segmentation device, the n video fragments to a download service path; generating first download addresses according to the download service path; and sending identifiers of the video fragments and the first download addresses to the task management device;

generating, by the task management device, an $i^{th}$ transcoding task according to an identifier of the $i^{th}$ video fragment, a first download address of the $i^{th}$ video fragment, and preset transcoding information, the transcoding information being used for indicating a transcoding bit rate corresponding to the video fragment; and the obtaining, by the transcoding device, an $i^{th}$ video fragment includes:

obtaining, by the transcoding device, the $i^{th}$ transcoding task; obtaining the first download address of the $i^{th}$ video fragment from the transcoding task; and downloading the $i^{th}$ video fragment according to the first download address.

In some embodiments, after the transcoding device obtains the $i^{th}$ target video fragment, the method further includes:

moving, by the transcoding device, the target video fragment to a download service path; generating a second download address according to the download service path, each target video fragment corresponding to a respective second download address; and sending an identifier of the target video fragment and the second download address to the task management device; and converting, by the task management device, a task state of the $i^{th}$ transcoding task to be a completed state.

In some embodiments, before the merging, by the merging device, the n target video fragments into a target video file, the method further includes:

generating, by the task management device, a merging task according to identifiers of the n target video fragments and the n second download addresses after the n transcoding tasks are all completed, the n target video fragments in each merging task corresponding to the same bit rate;

the merging, by the merging device, the n target video fragments into a target video file includes:

obtaining, by the merging device, the merging task; obtaining the second download addresses of the n target video fragments from the merging task; downloading the n target video fragments according to the second download addresses; and merging the n target video fragments into the target video file according to the identifiers of the n target video fragments; and after the merging, by the merging device, the n target video fragments into a target video file, the method further includes:

sending, by the merging device, state transition information to the task management device; and converting, by the task management device, a task state of the merging task to be a completed state according to the state transition information.

In some embodiments, the generating, by the segmentation device, transcoding configuration parameters according to the customized index parameter includes:

obtaining, by the segmentation device, a customized detail parameter from the material device according to the customized index parameter of the video file, the customized detail parameter being used for indicating the detailed information of the customized materials; generating the transcoding configuration parameters according to the video fragments and the customized detail parameter; and storing the transcoding configuration parameters into the transcoding configuration device; and the obtaining, by the transcoding device, a customized material corresponding to the $i^{th}$ video fragment according to the transcoding configuration parameters includes:

obtaining, by the transcoding device from the transcoding configuration device, a transcoding configuration parameter corresponding to the $i^{th}$ video fragment according to the $i^{th}$ video fragment; and obtaining the customized material corresponding to the $i^{th}$ video fragment according to the transcoding configuration parameter.

In some embodiments, the adding, by the transcoding device, the obtained customized material to the $i^{th}$ video fragment, to obtain an $i^{th}$ customized video fragment includes:

determining, by the transcoding device according to a type of the obtained customized material, an adding manner corresponding to the type of the customized material; and adding the customized material to the $i^{th}$ video fragment in the adding manner according to the transcoding configuration parameter, to obtain the $i^{th}$ customized video fragment.

According to yet another aspect, a segmentation method is provided. The method is applied to the segmentation device, and includes:

obtaining a video file and a customized index parameter of the video file, the customized index parameter being used for indicating identifiers of customized materials;

splitting the video file into n video fragments, n being a positive integer greater than 1; and generating transcoding configuration parameters according to the customized index parameter, the transcoding configuration parameters being used for indicating detailed information of the customized materials and a relationship between the customized materials and the video fragments.

In some embodiments, after the splitting the video file into n video fragments, the method further includes:

moving the n video fragments to a download service path;

generating first download addresses according to the download service path; and sending identifiers of the video fragments and the first download addresses to a task management device, to trigger the task management device to generate an $i^{th}$ transcoding task according to an identifier of an $i^{th}$ video fragment, a first download address of the $i^{th}$ video fragment, and preset transcoding information, the transcoding information being used for indicating a transcoding bit rate corresponding to the video fragment.

In some embodiments, the generating transcoding configuration parameters according to the customized index parameter includes:

obtaining a customized detail parameter from a material device according to the customized index parameter of the video file, the customized detail parameter being used for indicating detailed information of the customized material; and generating the transcoding configuration parameters according to the video fragments and the customized detail parameter;

after the generating transcoding configuration parameters according to the customized index parameter, the method further includes:

storing the transcoding configuration parameters into a transcoding configuration device.

According to another aspect, a segmentation apparatus is provided. The apparatus includes:

an obtaining module, configured to obtain a video file and a customized index parameter of the video file, the customized index parameter being used for indicating identifiers of customized materials;

a splitting module, configured to split the video file into n video fragments, n being a positive integer greater than 1; and a first generating module, configured to generate transcoding configuration parameters according to the customized index parameter, the transcoding configuration parameters being used for indicating detailed information of the customized materials and a relationship between the customized materials and the video fragments.

In some embodiments, the apparatus further includes:

a movement module, configured to move the n video fragments to a download service path;

a second generating module, configured to generate first download addresses according to the download service path to which the movement module moves the n video fragments; and a sending module, configured to send identifiers of the video fragments and the first download addresses generated by the second generating module to a task management device, to trigger the task management device to generate an $i^{th}$ transcoding task according to an identifier of an $i^{th}$ video fragment, a first download address of the $i^{th}$ video fragment, and preset transcoding information, the transcoding information being used for indicating a transcoding bit rate corresponding to the video fragment.

In some embodiments, the first generating module includes:

an obtaining unit, configured to obtain a customized detail parameter from a material device according to the customized index parameter of the video file, the customized detail parameter being used for indicating detailed information of the customized material; and a generating unit, configured to generate the transcoding configuration parameters according to the video fragments and the customized detail parameter that is obtained by the obtaining unit;

the apparatus further includes:

a storage module, configured to store the transcoding configuration parameters into a transcoding configuration device.

According to another aspect, a segmentation apparatus is provided. The segmentation apparatus includes a processor and a memory; the memory stores at least one instruction that is loaded and executed by the processor to implement the segmentation method according to the third aspect.

According to another aspect, a computer readable storage medium is provided. The storage medium stores at least one instruction that is loaded and executed by a processor to implement the segmentation method according to the third aspect.

According to another aspect, a transcoding method is provided. The method is applied to the foregoing transcoding device, and includes:

obtaining an $i^{th}$ video fragment, the $i^{th}$ video fragment being any one of n video fragments obtained by splitting a video file by a segmentation device, and i being a positive integer greater than or equal to 1 and less than or equal to n;

obtaining a customized material corresponding to the $i^{th}$ video fragment according to a transcoding configuration parameter, the transcoding configuration parameter being used for indicating detailed information of the customized material and a relationship between the customized material and the video fragment;

adding the obtained customized material to the $i^{th}$ video fragment, to obtain an $i^{th}$ customized video fragment; and transcoding the $i^{th}$ customized video fragment to obtain an $i^{th}$ target video fragment.

In some embodiments, the obtaining an $i^{th}$ video fragment includes:

obtaining an $i^{th}$ transcoding task, the $i^{th}$ transcoding task being generated by a task management device according to an identifier of the $i^{th}$ video fragment, a first download address of the $i^{th}$ video fragment, and preset transcoding information, the first download address being generated by the segmentation device according to a download service path to which the n video fragments are moved;

obtaining the first download address of the $i^{th}$ video fragment from the $i^{th}$ transcoding task; and downloading the $i^{th}$ video fragment according to the first download address.

In some embodiments, after the $i^{th}$ target video fragment is obtained, the method further includes:

moving the target video fragment to a download service path;

generating a second download address according to the download service path; and sending an identifier of the target video fragment and the second download address to the task management device, to trigger the task management device to convert a task state of the $i^{th}$ transcoding task to be a completed task.

In some embodiments, before the obtaining a customized material corresponding to the $i^{th}$ video fragment according to a transcoding configuration parameter, the method further includes:

obtaining, according to the $i^{th}$ video fragment, the transcoding configuration parameter corresponding to the $i^{th}$ video fragment from a transcoding configuration device.

In some embodiments, the adding the obtained customized material to the $i^{th}$ video fragment, to obtain an $i^{th}$ customized video fragment includes:

determining, according to a type of the obtained customized material, an adding manner corresponding to the type of the customized material; and adding the customized material to the $i^{th}$ video fragment in the adding manner according to the transcoding configuration parameter, to obtain the $i^{th}$ customized video fragment.

According to another aspect, a transcoding apparatus is provided. The apparatus is applied to a transcoding device in the foregoing aspect, and includes:

a first obtaining module, configured to obtain an $i^{th}$ video fragment, the $i^{th}$ video fragment being any one of n video fragments obtained by splitting a video file by a segmentation device, and i being a positive integer greater than or equal to 1 and less than or equal to n;

a second obtaining module, configured to obtain, according to a transcoding configuration parameter, a customized material corresponding to the $i^{th}$ video fragment obtained by the first obtaining module, the transcoding configuration parameter being used for indicating detailed information of the customized material and a relationship between the customized material and the video fragment;

an adding module, configured to add the obtained customized material obtained by the second obtaining module to the $i^{th}$ video fragment obtained by the first obtaining module, to obtain an $i^{th}$ customized video fragment; and a transcoding module, configured to transcode the $i^{th}$ customized video fragment obtained by the adding module, to obtain an $i^{th}$ target video fragment.

In some embodiments, the first obtaining module includes:

a first obtaining unit, configured to obtain an $i^{th}$ transcoding task, the $i^{th}$ transcoding task being generated by a task management device according to an identifier of the $i^{th}$ video fragment, a first download address of the $i^{th}$ video fragment, and preset transcoding information, the first download address being generated by the segmentation device according to a download service path to which the n video fragments are moved;

a second obtaining unit, configured to obtain the first download address of the $i^{th}$ video fragment from the $i^{th}$ transcoding task obtained by the first obtaining unit; and a downloading unit, configured to download the $i^{th}$ video fragment according to the first download address obtained by the second obtaining unit.

In some embodiments, the apparatus further includes:

a movement module, configured to move the target video fragment to a download service path;

a generating module, configured to generate a second download address according to the download service path to which the movement module moves the target video fragment; and a sending module, configured to send an identifier of the target video fragment and the second download address generated by the generating module to the task management device, to trigger the task management device to convert a task state of the $i^{th}$ transcoding task to be a completed task.

In some embodiments, the apparatus further includes:

a third obtaining module, configured to obtain, according to the $i^{th}$ video fragment, the transcoding configuration parameter corresponding to the $i^{th}$ video fragment from a transcoding configuration device.

In some embodiments, the adding module includes:

a determining unit, configured to determine, according to a type of the obtained customized material, an adding manner corresponding to the type of the customized material; and an adding unit, configured to add, according to the transcoding configuration parameter, the customized material to the $i^{th}$ video fragment in the adding manner determined by the determining unit, to obtain the $i^{th}$ customized video fragment.

According to another aspect, a transcoding apparatus is provided. The transcoding apparatus includes a processor and a memory; the memory stores at least one instruction that is loaded and executed by the processor to implement the foregoing transcoding method.

According to another aspect, a computer readable storage medium is provided. The storage medium stores at least one instruction that is loaded and executed by a processor to implement the foregoing transcoding method.

The technical solutions provided in the embodiments of this application achieve at least the following beneficial effects:

A segmentation device segments a video file; a transcoding configuration parameter is determined according to a customized index parameter of the video file; a transcoding device adds a customized material to a video fragment according to the transcoding configuration parameter and performs transcoding to obtain a target video fragment; a merging device merges n target video fragments belonging to the same video file into a complete target video file. The whole distributed system performs uniform management and scheduling according to transcoding configuration parameters. Therefore, when transcoding a video fragment, the transcoding device can determine a customized material corresponding to the video fragment according to the transcoding configuration parameter, and determine an adding position of the customized material in the video fragment, so that processes of adding customized materials to video fragments are independent of each other. Therefore, a plurality of transcoding devices may be used to process a plurality of video fragments of the same video file concurrently, so that customization processing and transcoding of the video file can be both performed by a plurality of devices concurrently, thereby improving efficiency of customizing and transcoding the video file.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show some embodiments of this application, and persons of ordinary skill in the art may still derive other drawings from these accompanying drawings without creative efforts.

DESCRIPTION OF EMBODIMENTS

Figure 1:
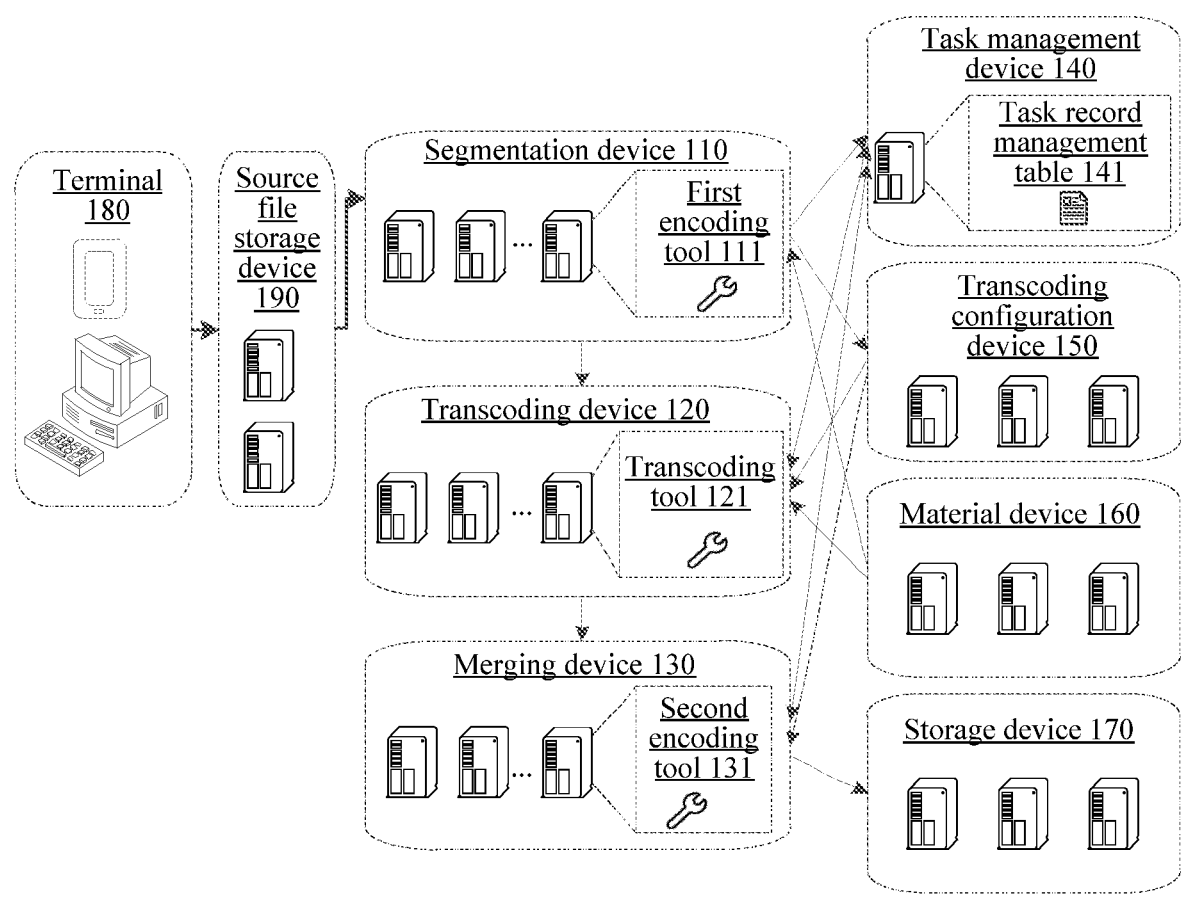
FIG. 1 is an architecture diagram of a video file transcoding system according to an embodiment of this application.

To make the objectives, technical solutions and advantages of this application clearer, the following describes the embodiments of this application in further detail with reference to the accompanying drawings.

For ease of understanding, first of all, some terms related to the embodiments of this application are illustrated:

A video source file is a video file that has not been transcoded, or a video file that needs to be transcoded, and is referred to as a video file for short in this application.

A target video file is a video file obtained through transcoding.

A customized material is a material file added to a video file, and includes at least one of a watermark file, a marquee file, an opening credits video file, a closing credits video file, and an interstitial video file.

A watermark file is a visible static picture added to each video frame or some video frames of a video file, for example, a logo or a video website.

A marquee file is a dynamic watermark file, for example, an animation displayed in an area in a video file.

An opening credits video file is a video segment added at the beginning of a video file, for example, an advertisement at the beginning, an opening song video of a TV drama.

A closing credits video file is a video segment added at the end of a video file, for example, an ending song video of a TV drama.

An interstitial video file is a video segment added in the video file, for example, an advertisement segment inserted during video playing.

A customized index parameter is used for indicating identifier information of a customized material, for example, a number of a customized material. Customized materials may be stored at a specified storage position in a centralized manner. In addition, for block customization of a video file, the customized index parameter may further include a block parameter (a block position and a block area), and the block parameter may be used directly.

A customized detail parameter is used for indicating detailed information of a customized material, for example, a file size of a customized material. Corresponding to a specific customized material, the customized detail parameter includes at least one of a file identifier of a watermark file, a storage path of a watermark file, insertion position information of a watermark file, insertion time information of a watermark file, a size of a watermark file, a file identifier of a marquee file, a storage path of a marquee file, insertion position information of a marquee file, insertion time information of a marquee file, a circulation strategy of a marquee file, a size of a marquee file, a file identifier of an opening credits video file, a storage path of an opening credits video file, duration of an opening credits video file, a file identifier of a closing credits video file, a storage path of a closing credits video file, duration of a closing credits video file, a file identifier of an interstitial video file, a storage path of an interstitial video file, insertion time information of an interstitial video file, and duration of an interstitial video file.

A transcoding configuration parameter is used for indicating detailed information of a customized material and a relationship between the customized material and a video fragment. The detailed information of a customized material includes at least one of a size of the customized material, an identifier of the customized material, a storage path of the customized material, information about a position where the customized material is inserted in a video file, and information about a time point when the customized material is inserted in the video file; the relationship between a customized material and a video fragment means information about a position where the customized material is inserted in the video fragment and/or information about a time point when the customized material is inserted in the video fragment.

A video fragment is a part of a video file. Each video file may include at least two video fragments.

A customized video fragment is a video fragment added with a customized material.

A target video fragment is a video fragment obtained through transcoding according to a customized video fragment. Because there may be a video fragment to which no customized material needs to be added, a target video fragment may be directly obtained by transcoding a video fragment.

Transcoding means encoding and compressing a video source file into a video file with a lower bit rate.

A bit rate is a quantity of data bits transmitted within a unit of time during data transmission. In some embodiments, the bit rate means a quantity of data bits transmitted within a unit of time when a video is transmitted on a network or between different functional modules in a device.

Definition means a degree of clarity of details and the boundary thereof on a video file. A higher bit rate generally indicates higher definition. In the field of online video, definition of a video file after transcoding generally includes at least one of ultra-definition, high definition, standard definition, and smooth. For example, ultra-definition corresponds to a resolution of 1920*1080, high definition corresponds to a resolution of 1280*720, standard definition corresponds to a resolution of 640*320, and smooth corresponds to a resolution of 320*180. After transcoding of the same video file, a plurality of target video files corresponding to different definition may be obtained.

Transcoding information is used for indicating a transcoding bit rate corresponding to a video fragment, and is usually one or more preset bit rates.

FIG. 1 is an architecture diagram of a video file transcoding system according to an embodiment of this application. As shown in FIG. 1, the system mainly includes: a segmentation device 110, a transcoding device 120, a merging device 130, a task management device 140, a transcoding configuration device 150, a material device 160, and a storage device 170.

The segmentation device 110 is connected to the transcoding device 120, the task management device 140, the transcoding configuration device 150, and the material device 160. The transcoding device 120 is connected to the segmentation device 110, the merging device 130, the task management device 140, the transcoding configuration device 150, and the material device 160. The merging device 130 is connected to the transcoding device 120, the task management device 140, the transcoding configuration device 150, and the storage device 170. In some embodiments, the segmentation device 110, the transcoding device 120, the merging device 130, the task management device 140, the transcoding configuration device 150, the material device 160, and the storage device 170 are all servers, and the servers are connected through a wired network or a wireless network.

The segmentation device 110 is configured to split a video file and parse a customized index parameter of the video file. A processing procedure of the segmentation device 110 corresponds to a segmentation stage of video file transcoding. A first encoding tool 111 is installed in each segmentation device 110. The first encoding tool 111 is a tool for splitting a video file. When the segmentation device 110 needs to split a video file, the segmentation device 110 may implement splitting by invoking the first encoding tool 111.

The segmentation device 110 parses the customized index parameter, so that a customized detail parameter of a customized material can be obtained.

During practical implementation, there may be a plurality of segmentation devices 110. Each segmentation device 110 splits one video file, and a plurality of segmentation devices 110 may process splitting of a plurality of video files concurrently.

The transcoding device 120 is configured to add a customized material to a video fragment, and transcode a customized video fragment. A processing procedure of the transcoding device 120 corresponds to a transcoding stage of video file transcoding. A transcoding tool 121 is installed in each transcoding device 120. The transcoding tool 121 is a tool for transcoding a material. When needing to transcode a video file, the transcoding device 120 may implement transcoding by invoking the transcoding tool 121.

In a possible embodiment, there may be a plurality of transcoding devices 120 (for example, at least two). Each transcoding device 120 processes one video fragment, and a plurality of transcoding devices 120 may perform concurrent processing, thereby shortening transcoding duration of a video file. In some embodiments, when the transcoding devices 120 have powerful processing capabilities, one transcoding device 120 may obtain two or more video fragments simultaneously and transcode the video fragments simultaneously.

The merging device 130 is configured to merge video fragments into a complete video file. Each video fragment to be merged corresponds to the same transcoding bit rate and/or definition, and all the video fragments belong to the same video file. A processing procedure of the merging device 130 corresponds to a merging stage of video file transcoding. A second encoding tool 131 is installed in each merging device 130. The second encoding tool 131 is a tool for merging video fragments. When needing to merge video fragments, the merging device 130 may implement merging by invoking the second encoding tool 131.

In a possible embodiment, there may be a plurality of merging devices 130 (for example, at least two). Each merging device 130 merges video fragment that correspond to the same definition and belong to the same video file. A plurality of merging devices 130 may process merging operations of a plurality of video files concurrently, or process merging operations, which correspond to different definition, of a plurality of video files concurrently.

In some embodiments, the segmentation device 110, the transcoding device 120, and the merging device 130 are devices independent of each other, for example, a plurality of servers independent of each other and connected by using a network.

In some embodiments, the segmentation device 110, the transcoding device 120, and the merging device 130 are the same device used for implementing different functions in different states of video file transcoding.

In some embodiments, any two of the segmentation device 110, the transcoding device 120, and the merging device 130 are the same device used for implementing different functions in different states of video file transcoding.

In an optional embodiment, the first encoding tool 111, the transcoding tool 121, and the second encoding tool 131 are the same software tool, and have different purposes in different devices, or may be considered to have different purposes in different stages. The first encoding tool 111 and the second encoding tool 131 may be the same software tool, or may be two independent software tools.

The task management device 140 is configured to generate and manage tasks. The task management device 140 is provided with a task record management table 141. The task record management table 141 is configured to record task information and task states (uncompleted or completed).

After the segmentation device 110 splits a video file into video fragments, the task management device 140 generates a transcoding task according to each video fragment, where task information of the transcoding task includes at least one of an identifier of the transcoding task, an identifier of the video file, an identifier of the video fragment, a download address of the video fragment, and preset transcoding information. After the transcoding device 120 successfully transcodes one video fragment, the task record management table 141 converts a task state of a transcoding task corresponding to the video fragment from an uncompleted state to a completed state.

After the transcoding device 120 finishes converting all video fragments of the same video file which correspond to the same definition, the task management device 140 generates a corresponding merging task, where task information of the merging task includes an identifier of the merging task, an identifier of the video file, identifiers of the video fragments, a download address of each video fragment, position information corresponding to each video fragment in the video file, and the like. The position information is used for indicating a sequence of the video fragments in the video file. After the merging device 130 finishes merging of one video file, the task record management table 141 converts a task state of a merging task corresponding to the video file from an uncompleted state to a completed state.

The transcoding configuration device 150 is configured to store a transcoding configuration parameter. The transcoding configuration parameter is generated by the segmentation device 110 according to a splitting rule of a video file and a customized detail parameter of a customized material by using the first encoding tool 111.

When transcoding a video fragment, the transcoding device 120 needs to obtain a transcoding configuration parameter from the transcoding configuration device 150, and then add a customized material to the corresponding video fragment according to the transcoding configuration parameter.

In some embodiments, when merging video fragments into a video file, the merging device 130 first obtains a transcoding configuration parameter from the transcoding configuration device 150, and then merges, according to a video fragment splitting rule indicated in the transcoding configuration parameter, the video fragments into a complete video file. In some embodiments, when merging video fragments into a video file, the merging device 130 directly merges the video fragments into a complete video file in sequence according to position information, which is included in a merging task, corresponding to each video fragment in the video file.

The material device 160 is configured to store customized materials.

When obtaining a customized index parameter of a video file, the segmentation device 110 obtains a corresponding customized material from the material device 160 according to the customized index parameter, and determines a customized detail parameter of the customized material. In some embodiments, the segmentation device 110 first queries whether the corresponding customized material is stored locally, and then obtains the corresponding customized material from the material device 160 when the corresponding customized material is not stored locally.

Before adding a customized material to a video fragment, the transcoding device 120 first needs to obtain the corresponding customized material from the material device 160, and then add the obtained customized material to the video fragment according to a transcoding configuration parameter. In some embodiments, the transcoding device 120 first queries whether the corresponding customized material is stored locally, and then obtains the corresponding customized material from the material device 160 when the corresponding customized material is not stored locally.

The storage device 170 is configured to store a target video file after transcoding. After merging target video fragments corresponding to the same definition into a complete target video file, the merging device 130 sends the target video file obtained through merging to the storage device 170 for storage. Because a plurality of target video files corresponding to different definition is obtained from the same video source file through transcoding, a plurality of video files with the same video content and different definition may be stored in the storage device 170.

In some embodiments, the video file transcoding system further includes: a terminal 180 and a source file storage device 190.

The terminal 180 is connected to the source file storage device 190, and the source file storage device 190 is connected to the segmentation device 110.

The terminal 180 is configured to generate or acquire a video source file. In some embodiments, the terminal 180 includes at least one of a smartphone, a tablet computer, a portable notebook computer, and a camera.

The source file storage device 190 is configured to store a video source file, which is referred to as a video file for short. The terminal 180 uploads a video source file and a customized index parameter to the source file storage device 190; the segmentation device 110 obtains the video file and the customized index parameter from the source file storage device 190.

In some embodiments, the video file transcoding system is a distributed transcoding system. The video file transcoding system is a distributed transcoding system including at least two transcoding devices. The video file transcoding system is a distributed transcoding system used for adding customized information to a video file during a transcoding process.

Figure 2:
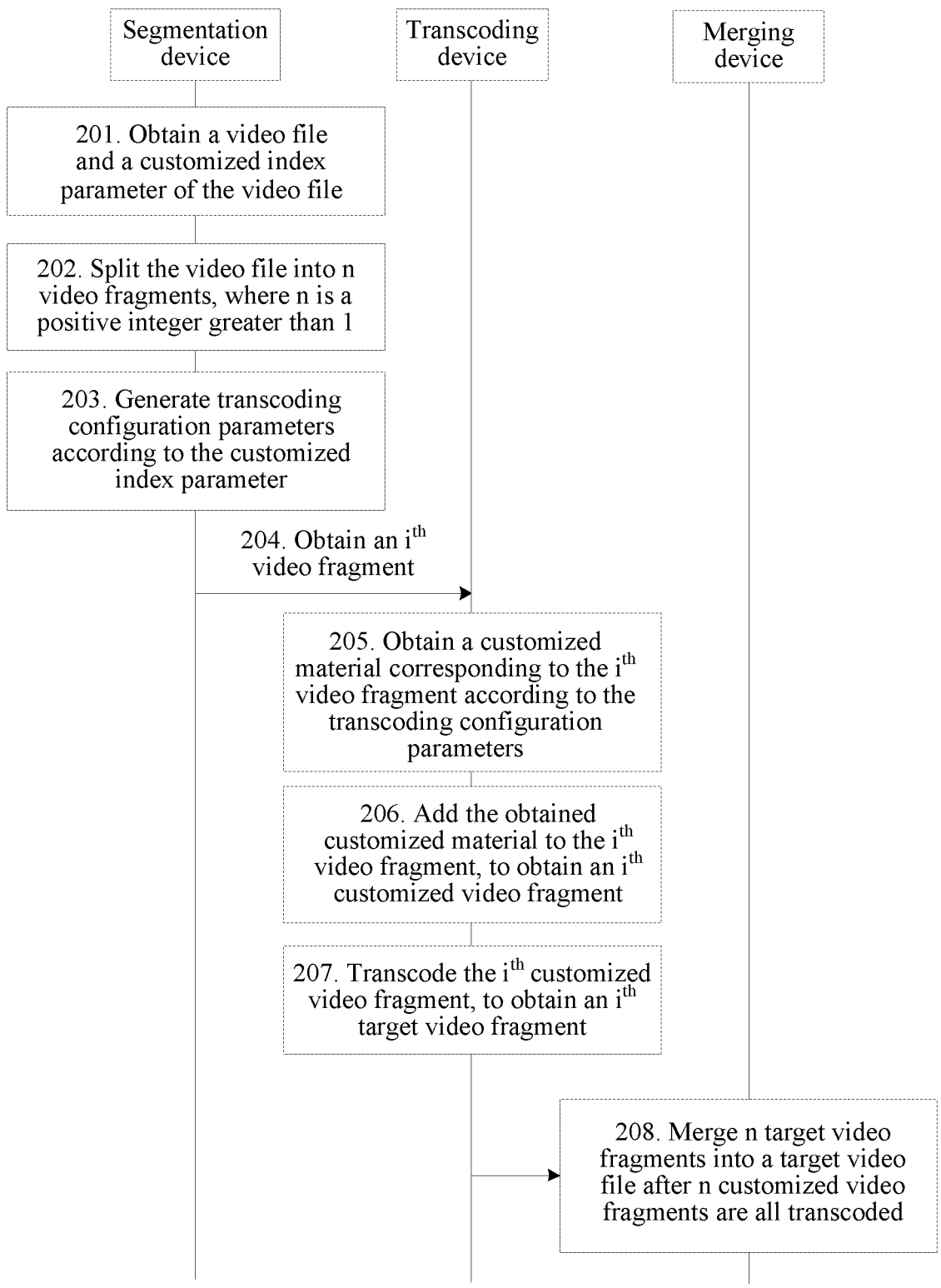
FIG. 2 is a method flowchart of a video file transcoding method according to an embodiment of this application.

FIG. 2 is a method flowchart of a video file transcoding method according to an embodiment of this application. The video file transcoding method is applied to the video file transcoding system shown in FIG. 1. As shown in FIG. 2, the video file transcoding method may include the following steps:

Step 201. A segmentation device obtains a video file and a customized index parameter of the video file.

In some embodiments, the customized index parameter of the video file is uploaded together with the video file. The customized index parameter is used for indicating a customization requirement of the video file and an identifier of a required customized material. For different customized materials, the customization requirement includes at least one of the following information: an area of the video file which needs to be blocked, an insertion position of a watermark file, and an insertion time of an interstitial video file.

Step 202. The segmentation device splits the video file into n video fragments, where n is a positive integer greater than 1.

In some embodiments, when the video file is split into n video fragments, each video fragment corresponds to the same or different duration. In a possible embodiment, the video file is generally split uniformly. For example, the video file is split into several video fragments with duration of 5 minutes.

Step 203. The segmentation device generates transcoding configuration parameters according to the customized index parameter.

The customized index parameter is used for indicating an identifier of a customized material, and the transcoding configuration parameter is used for indicating detailed information of the customized material and a relationship between the customized material and the video fragment.

The customization requirement indicated by the customized index parameter is described with respect to the whole video file. For example, an interstitial video file is inserted at the $20^{th}$ minute of the video file, and after the video file is split into video fragments, the customization requirement needs to be converted into a parameter corresponding to the video fragments. For example, an interstitial video file needs to be inserted at the $20^{th}$ minute of a 30-minute video file, and after the video file is split into three video fragments: a video fragment from the $0^{th}$ to the $10^{th}$ minute, a video fragment from the $10^{th}$ to the $15^{th}$ minute, and a video fragment from the $15^{th}$ to the $30^{th}$ minute, and a corresponding insertion position is the $5^{th}$ minute. Time can be converted by subtracting a start time of a corresponding video fragment from an insertion time of a material file.

Step 204. A transcoding device obtains an $i^{th}$ video fragment.

The $i^{th}$ video fragment is any one of the n video fragments, where i is a positive integer greater than or equal to 1 and less than or equal to n.

In some embodiments, the $i^{th}$ video fragment obtained by the transcoding device is any one of video fragments that have not been transcoded.

Step 205. The transcoding device obtains a customized material corresponding to the $i^{th}$ video fragment according to the transcoding configuration parameters.

Because the transcoding configuration parameter is converted from the customized index parameter of the video file, the transcoding configuration parameter can indicate customized materials that need to be used by the video fragment. Before adding customized information to a video fragment, the transcoding device only needs to obtain the customized material corresponding to the video fragment.

In some embodiments, the transcoding device performs a query locally to determine whether the corresponding customized material is stored; if the corresponding customized material is stored, the transcoding device directly obtains the locally stored customized material.

In some embodiments, when the transcoding device does not find the corresponding customized material locally, the transcoding device obtains the corresponding customized material from a material device according to video identifier information indicated by the transcoding configuration parameter.

Step 206. The transcoding device adds the obtained customized material to the $i^{th}$ video fragment, to obtain an $i^{th}$ customized video fragment.

A customized video fragment is a video fragment added with a customized material.

The transcoding device adds the customized material to the video fragment according to an adding position, which is indicated by the transcoding configuration parameter, of the customized material in the video fragment.

Step 207. The transcoding device transcodes the $i^{th}$ customized video fragment, to obtain an $i^{th}$ target video fragment.

During transcoding, the transcoding device encodes the video fragment according to a preset bit rate, and outputs a target video fragment corresponding to the preset bit rate.

Step 208. A merging device merges n target video fragments into a target video file after n customized video fragments are all transcoded.

The n customized video fragments are transcoded to obtain target video fragments having the same bit rate. After each video fragment of the video file is converted, through transcoding, into a target video fragment having the same definition or the same bit rat, the merging device merges the n target video fragments to obtain a target video file corresponding to the definition or the bit rate.

The same video file may be transcoded into a plurality of target video files corresponding to different definition.

It should be noted that, step 201 to step 203 may be implemented as an independent segmentation method applied to the segmentation device, step 204 to step 207 may be implemented as an independent transcoding method applied to the transcoding device; and step 208 may be implemented as an independent merging method applied to the merging device.

In conclusion, in the video file transcoding method provided in this embodiment of this application, a segmentation device segments a video file; a transcoding configuration parameter is determined according to a customized index parameter of the video file; a transcoding device adds a customized material to a video fragment according to the transcoding configuration parameter and performs transcoding to obtain a target video fragment; a merging device merges n target video fragments belonging to the same video file into a complete target video file. The whole distributed transcoding system performs uniform management and scheduling according to transcoding configuration parameters. Therefore, when transcoding a video fragment, the transcoding device can determine a customized material corresponding to the video fragment according to the transcoding configuration parameter, and determine an adding position of the customized material in the video fragment, so that processes of adding customized materials to video fragments are independent of each other. Therefore, a plurality of transcoding devices may be used to process a plurality of video fragments of the same video file concurrently, so that customization processing and transcoding of the video file can be both performed by a plurality of devices concurrently, thereby improving efficiency of customizing and transcoding the video file.

Figure 3:
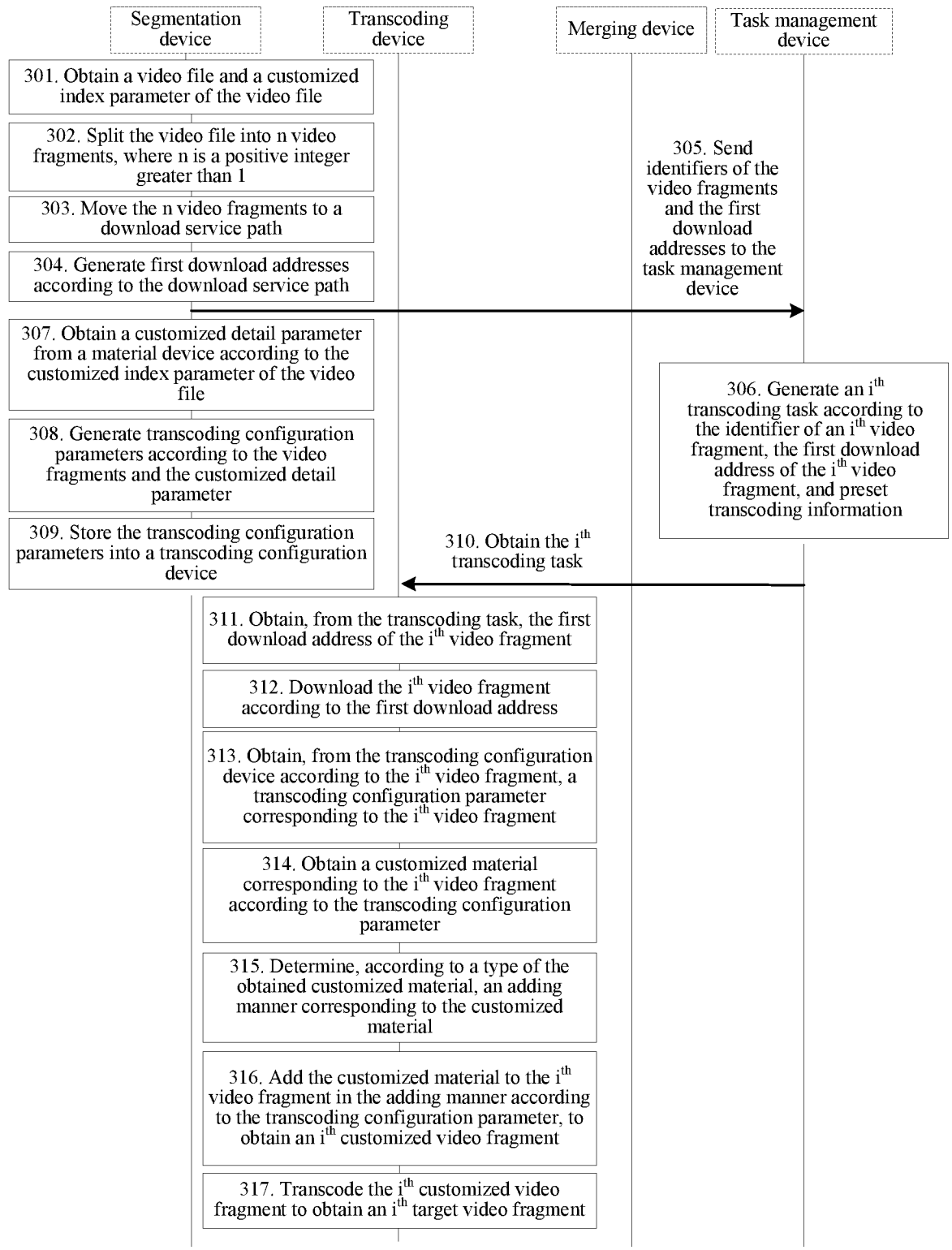
FIG. 3 is a method flowchart of a video file transcoding method according to another embodiment of this application.
Figure 4:
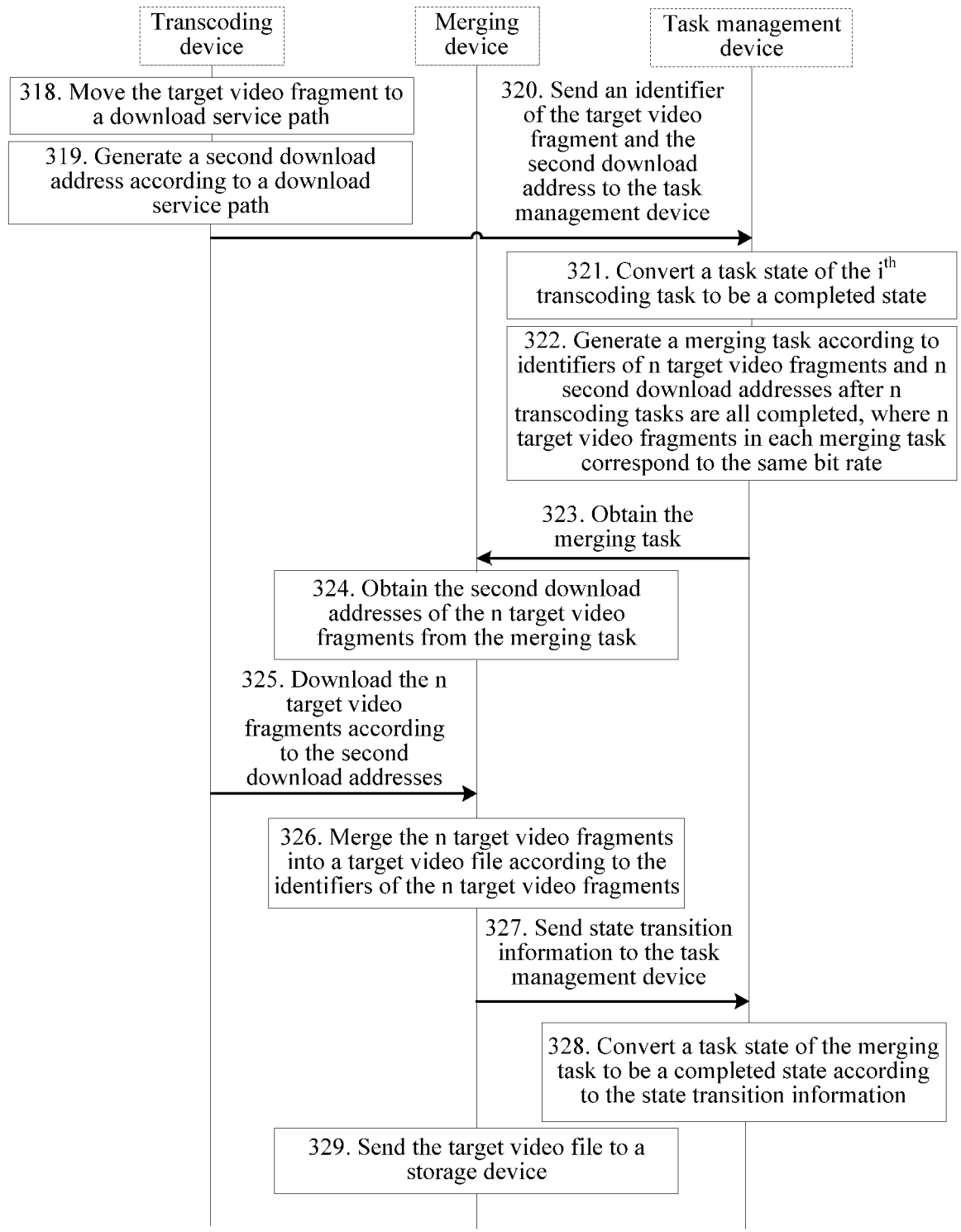
FIG. 4 is a method flowchart of a video file transcoding method according to another embodiment of this application.

FIG. 3 and FIG. 4 are method flowcharts of a video file transcoding method according to another embodiment of this application. The video file transcoding method is applied to the video file transcoding system in FIG. 1. As shown in FIG. 3 and FIG. 4, the video file transcoding method may include the following steps:

Step 301. A segmentation device obtains a video file and a customized index parameter of the video file.

In some embodiments, the customized index parameter of the video file is uploaded together with the video file. The customized index parameter is used for indicating a customization requirement of the video file and an identifier of a required customized material. The customization requirement includes, for example, an area of the video file which needs to be blocked, an insertion position of a watermark file, and an insertion time of an interstitial video file.

In some embodiments, after obtaining the video file, the segmentation device first analyzes the video file to determine whether the video file uses the video file transcoding system. Generally, during practical implementation, the video file transcoding system supports transcoding of video files in a predetermined format. Therefore, it is first necessary to determine whether the video file is in the predetermined format. If the video file is a video file using the predetermined format, the video file needs to be transcoded by using the video file transcoding system. If the video file is not a video file using the predetermined format, the video file does not need to be transcoded by using the video file transcoding system.

Step 302. The segmentation device splits the video file into n video fragments, where n is a positive integer greater than 1.

In some embodiments, when the video file is split into n video fragments, each video fragment corresponds to the same or different duration. In a possible embodiment, the video file is generally split uniformly.

With reference to FIG. 1, the segmentation device 110 invokes a first encoding tool 111 and transmits the video file to the first encoding tool 111. The first encoding tool 111 splits the video file according to a predetermined splitting rule.

Step 303. The segmentation device moves the n video fragments to a download service path.

The segmentation device has a built-in download service path, and the video file being moved to the download service path means that the video file can be downloaded on the segmentation device.

The download service path refers to a local download service path located on the segmentation device. In other words, the download service path is a download service path in the segmentation device.

Step 304. The segmentation device generates first download addresses according to the download service path.

The first download address is used for indicating a storage position of a video fragment.

In some embodiments, after the segmentation device moves the n video fragments to the download service path, if another device needs to obtain a video fragment, the device may obtain the corresponding video fragment according to the first download address. Usually, each video fragment has a different first download address, and the video fragments correspond to respective first download addresses.

Step 305. The segmentation device sends identifiers of the video fragments and the first download addresses to a task management device.

In some embodiments, the identifiers of the video fragments are associated with an identifier of the video file. For example, if the identifier of the video file is video 250, the identifier of the first video fragment is video 250-1, and the identifier of the second video fragment is video 250-2, and so on.

By associating the identifier of the video fragment with the identifier of the video file, it can be determined which video file the video fragment belongs to.

The identifiers of the video fragments and the first download addresses are stored in the task management device, and another device can obtain the first download addresses of the video fragments from the task management device, thereby obtaining the corresponding video fragments according to the first download addresses.

Step 306. The task management device generates an $i^{th}$ transcoding task according to an identifier of an $i^{th}$ video fragment, a first download address of the $i^{th}$ video fragment, and preset transcoding information.

The transcoding information is used for indicating a bit rate or definition corresponding to the video fragment.

In some embodiments, Definition of a video includes at least one of ultra-definition, high definition, standard definition, and smooth. Each definition corresponds to a bit rate. One video file needs to be transcoded into target video files corresponding to different definition. Therefore, the task management device may generate a plurality of transcoding tasks corresponding to the same video fragment according to different preset transcoding information Step 307. The segmentation device obtains a customized detail parameter from a material device according to the customized index parameter of the video file.

The segmentation device sends the customized index parameter to the material device, and the material device searches for a corresponding customized material according to the customized index parameter, and sends the found customized material to the segmentation device. The segmentation device determines a customized detail parameter according to the obtained customized material.

In some embodiments, the segmentation device first queries, according to the customized index parameter, whether the corresponding customized material is stored locally. If it is found that the corresponding customized material is stored locally, the segmentation device obtains the local customized material directly. If the corresponding customized material is not stored locally or the locally stored customized material has expired, the segmentation device needs to obtain the corresponding customized material from the material device.

Step 308. The segmentation device generates transcoding configuration parameters according to the video fragments and the customized detail parameter.

The customized detail parameter is described with respect to the whole video file. For example, an interstitial video file is inserted at the $20^{th}$ minute of the video file.

The transcoding configuration parameter is described with respect to the video fragment. For example, an interstitial video file is inserted at the $5^{th}$ minute of the video fragment.

For example, an interstitial video file needs to be inserted at the $20^{th}$ minute of a 30-minute video file, and after the video file is split into three video fragments: a video fragment from the $0^{th}$ to the $10^{th}$ minute, a video fragment from the $10^{th}$ to the $15^{th}$ minute, and a video fragment from the $15^{th}$ to the $30^{th}$ minute, the interstitial video file should be inserted into the video fragment from the $15^{th}$ to $30^{th}$ minute, and a corresponding insertion position is the $5^{th}$ minute. Time can be converted by subtracting a start time of a corresponding video fragment from an insertion time of a material file.

According to the splitting rule of the video fragments, the segmentation device splits the customized detail parameter for the complete video file into respective transcoding configuration parameters corresponding to all the video fragments based on the splitting rule.

In some embodiments, the transcoding configuration parameter further includes a shared parameter that needs to be transformed uniformly for all the video fragments, for example, a parameter indicating which transcoding tool is selected.

The transcoding configuration parameters are used for storing the customized information of the video file together with the customized information of all the video fragments. A possible implementation of the transcoding configuration parameters is as follows: an identifier of a video file—a shared parameter—an identifier of a video fragment 1 (a customized material identifier and a customization mode)—an identifier of a video fragment 2 (a customized material identifier and a customization mode)—an identifier of a video fragment 3 (a customized material identifier and a customization mode). The customization mode is used for indicating a specific adding position of the customized material in the video fragment, an adding time, and the like.

Step 309. The segmentation device stores the transcoding configuration parameters into a transcoding configuration device.

After the segmentation device stores the transcoding configuration parameters into the transcoding configuration device, when needing to obtain the transcoding configuration parameters, the transcoding device or the merging device obtains the transcoding configuration parameters from the transcoding configuration device according to the identifier of the video file.

Step 310. The transcoding device obtains the $i^{th}$ transcoding task.

The transcoding tasks are stored in the task management device, and the transcoding device obtains one of the transcoding tasks from the task management device.

The $i^{th}$ transcoding task corresponds to a transcoding operation of the $i^{th}$ video fragment. During transcoding, transcoding devices perform concurrent processing. When obtaining transcoding tasks, the transcoding devices do not necessarily obtain the transcoding tasks according to the sequence of the video fragments corresponding to the transcoding tasks. Each transcoding device in an idle state obtains an uncompleted transcoding task from the task management device.

In some embodiments, when the transcoding devices have powerful processing capabilities, one transcoding device may obtain more than one video fragment each time and transcode the video fragments simultaneously.

Step 311. The transcoding device obtains, from the transcoding task, the first download address of the $i^{th}$ video fragment.

The transcoding task includes the first download address of the video fragment. When obtaining the $i^{th}$ transcoding task, the transcoding device downloads, according to the first download address of the $i^{th}$ video fragment which is included in the $i^{th}$ transcoding task, the $i^{th}$ video fragment from a location indicated by the first download address.

Step 312. The transcoding device downloads the $i^{th}$ video fragment according to the first download address.

Step 313. The transcoding device obtains, from the transcoding configuration device according to the $i^{th}$ video fragment, a transcoding configuration parameter corresponding to the $i^{th}$ video fragment.

The $i^{th}$ video fragment has identifier information. The transcoding device searches, in the transcoding configuration device according to the identifier information of the $i^{th}$ video fragment, a transcoding configuration parameter required for transcoding the $i^{th}$ video fragment.

In some embodiments, because identifier information of a video fragment is associated with identifier information of a video file to which the video fragment belongs, the transcoding device searches for a corresponding transcoding configuration parameter in the transcoding configuration device according to the identifier information of the video file.

Step 314. The transcoding device obtains a customized material corresponding to the $i^{th}$ video fragment according to the transcoding configuration parameters.

The transcoding device determines, in the transcoding configuration parameter according to the identifier information of the $i^{th}$ video fragment, information about the customized material corresponding to the video fragment. For example, the transcoding device determines an identifier and an adding time of the customized material.

The transcoding device sends the identifier of the customized material to the material device. The material device searches for the corresponding customized material according to the identifier of the customized material, and sends the found customized material to the transcoding device.

In some embodiments, the transcoding device first queries whether the corresponding customized material is stored locally. If it is found that the corresponding customized material is stored locally, the transcoding device obtains the local customized material directly. If the corresponding customized material is not stored locally or the locally stored customized material has expired, the transcoding device obtains the corresponding customized material from the material device.

Step 315. The transcoding device determines, according to a type of the obtained customized material, an adding manner corresponding to the customized material.

Because some customized materials are in a picture format, and some are in a video format, different types of customized materials have different adding manners.

For different types of customized materials, the following provides adding manners of some customized materials:

When a watermark file needs to be added to the $i^{th}$ video fragment, insertion position information of the watermark file and insertion time information of the watermark file are obtained, first video frames in the $i^{th}$ video fragment that correspond to the insertion time information are determined, and the watermark file is inserted at a position corresponding to the insertion position information in each first video frame.

When block processing needs to be performed on the $i^{th}$ video fragment, a block position and a block time are obtained, second video frames in the $i^{th}$ video fragment which correspond to the block time are obtained, and a position corresponding to the block position is blocked in each second video frame. The block processing includes blurring, obstruction with a picture, and the like.

When the $i^{th}$ video fragment is the first video fragment, an opening credits video file is inserted in front of the first video fragment. The first video fragment is a video fragment in the forefront of the video file.

When the $i^{th}$ video fragment is an $n^{th}$ video fragment, a closing credits video file is inserted after the $n^{th}$ video fragment. The $n^{th}$ video fragment is the last video fragment of the video file.

When an interstitial video file needs to be inserted into the $i^{th}$ video fragment, insertion time information of the interstitial video file is obtained, and the interstitial video file is inserted at a position corresponding to the insertion time information in the $i^{th}$ video fragment.

When a marquee file needs to be inserted into the $i^{th}$ video fragment, insertion position information of the marquee file, insertion time information of the marquee file, and a circulation strategy of the marquee file are obtained; the marquee file is split into animation frames; third video frames corresponding to the animation frames are determined in the $i^{th}$ video fragment according to the insertion time information; and the animation frames are inserted at positions corresponding to the insertion position information in the third video frames.

Step 316. The transcoding device adds the customized material to the $i^{th}$ video fragment in the adding manner according to the transcoding configuration parameter, to obtain an $i^{th}$ customized video fragment.

The customized video fragment is a video fragment added with a customized material.

With reference to FIG. 1, the transcoding device 120 invokes the transcoding tool 121 to add the customized material to the $i^{th}$ video fragment.

The used transcoding tool is determined according to the shared parameter in the transcoding configuration parameter.

Step 317: The transcoding device transcodes the $i^{th}$ customized video fragment to obtain an $i^{th}$ target video fragment.

With reference to FIG. 1, the transcoding device 120 invokes the transcoding tool 121 to transcode the customized video fragment. During transcoding, the transcoding tool 121 transcodes, according to the preset transcoding information indicated by the transcoding task, the customized video fragment into a video fragment having a bit rate or definition corresponding to the preset transcoding information.

The target video fragment is a video fragment obtained after transcoding.

Step 318. The transcoding device moves the target video fragment to a download service path.

The download service path herein is on the transcoding device. After the target video fragment is moved to the download service path, another device can download the target video fragment from the transcoding device.

Step 319. The transcoding device generates a second download address according to a download service path.

The second download address is used for indicating a storage position of the target video fragment.

After the transcoding device moves the target video fragment to the download service path, if needing to obtain the target video fragment, another device may obtain the corresponding target video fragment according to the second download address. Usually, each target video fragment has a different second download address, and all target video fragments correspond to respective second download addresses.

Step 320. The transcoding device sends an identifier of the target video fragment and the second download address to the task management device.

After finishing the transcoding operation corresponding to the transcoding task, the transcoding device sends a feedback to the task management device. After the transcoding device sends the second download address to the task management device, the merging device may obtain the corresponding target video fragment according to the second download address.

Step 321. The task management device converts a task state of the $i^{th}$ transcoding task to be a completed state.

After receiving the feedback from the transcoding device, the task management device needs to modify the task state of the corresponding transcoding task.

Step 322. The task management device generates a merging task according to identifiers of n target video fragments and n second download addresses after n transcoding tasks are all completed, where n target video fragments in each merging task correspond to the same bit rate.

The n transcoding tasks being all completed means that task states corresponding to the n transcoding tasks recorded in the task management device are all completed states.

After determining that the n transcoding tasks are all completed, the task management device generates a merging task, where the merging task includes the identifier information of the video file, identifier information of each target video fragment, and the second download address of each target video fragment.

It should be noted that, the n transcoding tasks include the same preset transcoding information, that is, the n transcoding tasks are used to transcode n video fragments belonging to the same video file into video fragments having the same bit rate or definition.

Step 323. The merging device obtains the merging task.

In an idle state, the merging device obtains a merging task from the task management device.

Step 324. The merging device obtains the second download addresses of the n target video fragments from the merging task.

The n target video fragments correspond to n second download addresses. The merging device obtains the second download address corresponding to each target video fragment from the merging task.

Step 325. The merging device downloads the n target video fragments according to the second download addresses.

Different target video fragments may be obtained by different transcoding devices, and after obtaining a target video fragment, each transcoding device moves the target video fragment to a local download service path. Therefore, the merging device obtains, according to respective second download addresses, corresponding target video fragments from download service paths in respective transcoding devices corresponding to the target video fragments.

Step 326. The merging device merges the n target video fragments into a target video file according to the identifiers of the n target video fragments.

The identifier of the video fragment usually remains unchanged after addition of the customized material and transcoding. Therefore, the identifier of the target video fragment is usually the same as the identifier of the video fragment.

When the video file is split into video fragments, a sequence of the video fragments may be embodied in the identifiers of the video fragments.

In some embodiments, the merging device merges the n target video fragments according to the sequence indicated by the identifiers of the n target video fragments.

In some embodiments, because the transcoding configuration information is obtained according to the splitting rule of the video file, the transcoding configuration information can be used for describing the sequence of the video fragments. The merging device may obtain the transcoding configuration information from the transcoding configuration device, and then merge the n target video fragments according to the transcoding configuration information.

Step 327. The merging device sends state transition information to the task management device.

After completing a merging operation indicated by the merging task, the merging device needs to send a feedback to the task management device.

The state transition information is used for indicating that the merging task is completed. The state transition information includes the identifier of the video file, an identifier of the merging task, or the like.

Step 328. The task management device converts a task state of the merging task to be a completed state according to the state transition information.

After receiving the state transition information, the task management device converts the task state of the merging task. During distribution of other merging tasks, it can be avoided that a completed merging task is issued again.

Step 329. The merging device sends the target video file to a storage device.

After obtaining the target video file through merging, the merging device sends the target video file to the storage device for uniform storage and management.

In some embodiments, after the merging device stores the target video file, the merging device configures other information for the target video file, for example, performs Peer to Peer (P2P) processing or generates a HTTP Live Streaming (HLS) format. P2P means that when a first terminal plays a video file and a second terminal needs to play the same video file, the second terminal can obtain the video file from the first terminal, and does not need to obtain the video file from a server, thereby saving the bandwidth. HLS is a video format supported on a specific terminal.

Figure 5:
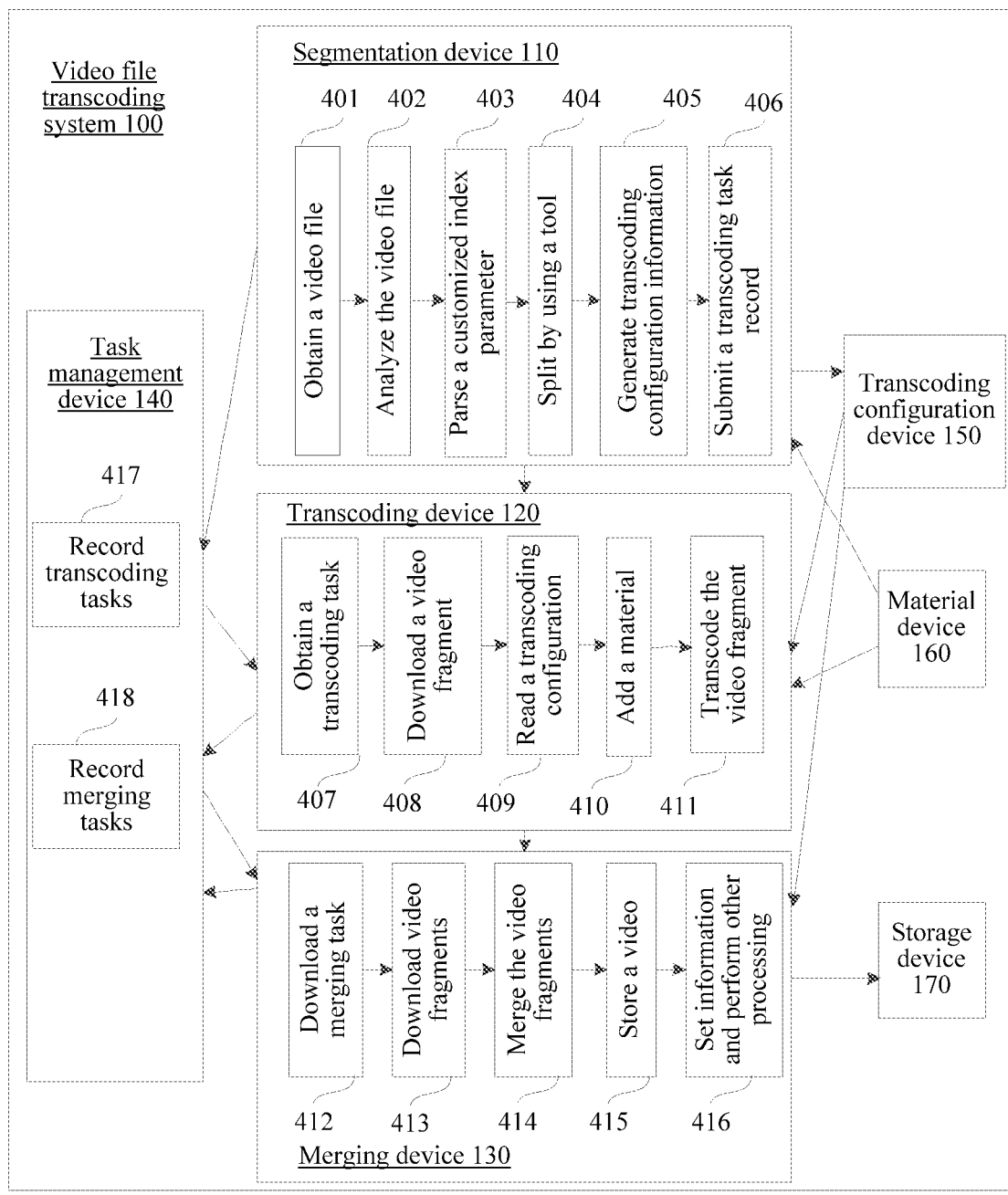
FIG. 5 is a schematic diagram of a video file transcoding method according to an embodiment of this application.

The following schematically illustrates the video file transcoding method in this embodiment with reference to FIG. 5. As shown in FIG. 4, a video file transcoding system 100 includes a segmentation device 110, a transcoding device 120, a merging device 130, a task management device 140, a transcoding configuration device 150, a material device 160, and a storage device 170.

In the segmentation device 110, step 401 is first performed to obtain a video file, that is, obtain a video file and a customized index parameter corresponding to the video file; then, step 402 is performed to analyze the video file, that is, analyze whether the video file is a video file that needs to be transcoded; next, step 403 is performed to parse the customized index parameter; then, step 404 is performed, in which splitting is performed by using a tool, where the segmentation device 110 invokes a first encoding tool to split the video file; next, step 405 is performed, where the segmentation device 11 generates transcoding configuration information; and finally, step 406 is performed to submit a transcoding task record. The segmentation device 110 needs to interact with the task management device 140, the transcoding configuration device 150, and the material device 160. The segmentation device 110 needs to obtain a customized material from the material device 160, sends transcoding configuration information to the transcoding configuration device 150, and submits a transcoding task record to the task management device 140.

In the transcoding device 120, step 407 is first performed to obtain a transcoding task; then, step 408 is performed to download a video fragment; next, step 409 is performed to read a transcoding configuration; then, step 410 is performed to add a material; and finally, step 411 is performed to transcode a video fragment. The transcoding device 120 needs to interact with the task management device 140, the transcoding configuration device 150, the segmentation device 110, and the material device 160. The transcoding device 120 obtains a transcoding task from the task management device 140, obtains a transcoding configuration parameter from the transcoding configuration device 150, obtains a customized material from the material device 160, and obtains a video fragment from the segmentation device 110.

In the merging device 130, step 412 is first performed to obtain a merging task; then, step 413 is performed to download fragments; next, step 414 is performed to merge the video fragments; then, step 415 is performed to store a video (a target video file); and next, step 416 is performed to configure information and perform other processing. The merging device 130 needs to interact with the task management device 140, the transcoding configuration device 150, the transcoding device 120, and the storage device 170. The merging device 130 obtains a merging task from the task management device 140, obtains transcoding configuration information from the transcoding configuration device 150, obtains to-be-merged video fragments from the transcoding device 120, and stores a merged video into the storage device 170.

In the task management device 140, the task management device 140 mainly perform step 417 to record transcoding tasks, and step 418 to record merging tasks.

It should be noted that, step 301 to step 305, and step 307 to step 309 may be implemented as an independent segmentation method applied to a segmentation device; step 306, step 321, step 322, and step 328 may be implemented as an independent task management method applied to a task management device; step 310 to step 320 may be implemented as an independent transcoding method applied to a transcoding device; step 323 to step 327, and step 329 may be implemented as an independent merging method applied to a merging device.

In conclusion, in the video file transcoding method provided in this embodiment of this application, a segmentation device segments a video file; a transcoding configuration parameter is determined according to a customized index parameter of the video file; a transcoding device adds a customized material to a video fragment according to the transcoding configuration parameter and performs transcoding to obtain a target video fragment; a merging device merges n target video fragments belonging to the same video file into a complete target video file. The whole distributed transcoding system performs uniform management and scheduling according to transcoding configuration parameters. Therefore, when transcoding a video fragment, the transcoding device can determine a customized material corresponding to the video fragment according to the transcoding configuration parameter, and determine an adding position of the customized material in the video fragment, so that processes of adding customized materials to video fragments are independent of each other. Therefore, a plurality of transcoding devices may be used to process a plurality of video fragments of the same video file concurrently, so that customization processing and transcoding of the video file can be both performed by a plurality of devices concurrently, thereby improving efficiency of customizing and transcoding the video file.

In step 303 to step 306, the segmentation device moves video fragments to a download service path and generates first download addresses; the task management device generates transcoding tasks according to identifiers of the video fragments and the first download addresses, so that after obtaining a transcoding task, the transcoding device can download, according to the first download address, a video fragment that needs to be transcoded, and obtains a transcoding configuration parameter according to the identifier of the video fragment, thereby determining the video fragment and a customized material that are required for transcoding, and adding the customized material according to the transcoding configuration parameter. The task management device is used for uniform scheduling and management, so that customized materials can be added to video fragments independently and a plurality of transcoding devices can perform transcoding tasks concurrently, thereby reducing transcoding duration of a video file and improving transcoding efficiency.

For step 319 to step 323, the transcoding device moves a target video fragment to a download service path, generates a second download address, and sends the second download address to the task management device. The task management device stores the second download address, and converts a task state to be a completed state, so that during subsequent distribution of transcoding tasks, the task management device does not repeatedly issue a transcoding task already completed. In addition, after n video fragments are all transcoded, the task management device generates a merging task. During merging, the merging device obtains the second download address of each target video fragment from the merging task, and obtains, according to the second download addresses, the target video fragments that need to be merged. The task management device is used for uniform scheduling and management, so that a merging task can be generated in time after all the n video fragments are transcoded, to merge the target video fragments, thereby improving the transcoding efficiency of the video file.

Figure 6:
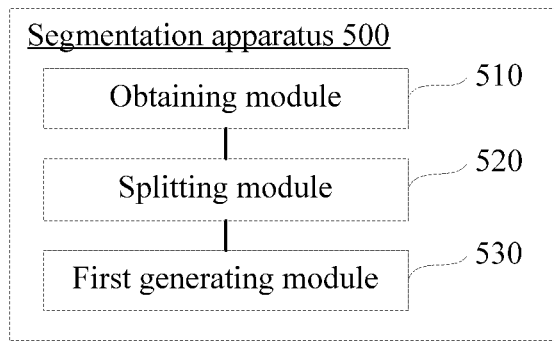
FIG. 6 is a structural block diagram of a segmentation apparatus according to an embodiment of this application.

FIG. 6 is a structural block diagram of a segmentation apparatus according to an embodiment of this application. The segmentation apparatus 500 being applied to the segmentation device 110 shown in FIG. 1 is used as an example for description. In other words, the segmentation apparatus 500 becomes all or a part of the segmentation device 110 through software, hardware, or a combination thereof. As shown in FIG. 6, the segmentation apparatus 500 includes: an obtaining module 510, a splitting module 520, and a first generating module 530.

The obtaining module 510 is configured to implement step 201 and step 301 above, as well as any other implicit or disclosed obtaining-related function.

The splitting module 520 is configured to implement step 202 and step 302 above, as well as any other implicit or disclosed splitting-related function.

The first generating module 530 is configured to implement step 203 and step 303 above, as well as any other implicit or disclosed generating-related function.

In some embodiments, the segmentation apparatus 500 further includes: a movement module, a second generating module, a sending module, and a storage module.

The movement module is configured to implement step 303 above and any other implicit or disclosed movement-related function.

The second generating module is configured to implement step 304 above and any other implicit or disclosed generating-related function.

The sending module is configured to implement step 305 above and any other implicit or disclosed sending-related function.

The storage module is configured to implement step 309 above and any other implicit or disclosed storage-related function.

In some embodiments, the first generating module 530 includes: an obtaining unit and a generating unit.

The obtaining unit is configured to implement step 307 above and any other implicit or disclosed obtaining-related function.

The generating unit is configured to implement step 308 above and any other implicit or disclosed generating-related function.

In conclusion, in the segmentation apparatus provided in this embodiment of this application, a segmentation device segments a video file; a transcoding configuration parameter is determined according to a customized index parameter of the video file; a transcoding device adds a customized material to a video fragment according to the transcoding configuration parameter and performs transcoding to obtain a target video fragment; a merging device merges n target video fragments belonging to the same video file into a complete target video file. The whole distributed transcoding system performs uniform management and scheduling according to transcoding configuration parameters. Therefore, when transcoding a video fragment, the transcoding device can determine a customized material corresponding to the video fragment according to the transcoding configuration parameter, and determine an adding position of the customized material in the video fragment, so that processes of adding customized materials to video fragments are independent of each other. Therefore, a plurality of transcoding devices may be used to process a plurality of video fragments of the same video file concurrently, so that customization processing and transcoding of the video file can be both performed by a plurality of devices concurrently, thereby improving efficiency of customizing and transcoding the video file.

The segmentation device moves video fragments to a download service path and generates first download addresses; the task management device generates transcoding tasks according to identifiers of the video fragments and the first download addresses, so that after obtaining a transcoding task, the transcoding device can download, according to the first download address, a video fragment that needs to be transcoded, and obtains a transcoding configuration parameter according to the identifier of the video fragment, thereby determining the video fragment and a customized material that are required for transcoding, and adding the customized material according to the transcoding configuration parameter. The task management device is used for uniform scheduling and management, so that customized materials can be added to video fragments independently and a plurality of transcoding devices can perform transcoding tasks concurrently, thereby reducing transcoding duration of a video file and improving transcoding efficiency.

Specific manners in which the modules in the segmentation apparatus in the foregoing embodiment perform operations have been described in detail in the steps related to the segmentation method in the embodiments in FIG. 2 and FIG. 3, and are not described in detail herein again.

An embodiment of this application further provides a segmentation apparatus. The segmentation apparatus includes a processor and a memory. The memory stores at least one instruction that is loaded and executed by the processor to implement the segmentation method described in step 201 to step 203 in FIG. 2, and in step 301 to step 305 and step 307 to step 309 in FIG. 3 and FIG. 4.

In an exemplary embodiment, a computer readable storage medium is further provided. The storage medium stores at least one instruction that is loaded and executed by a processor to implement the segmentation method described in step 201 to step 203 in FIG. 2, and in step 301 to step 305 and step 307 to step 309 in FIG. 3 and FIG. 4.

In an exemplary embodiment, a computer program product is further provided. The computer program product stores at least one instruction that is loaded and executed by a processor to implement the segmentation method described in step 201 to step 203 in FIG. 2, and in step 301 to step 305 and step 307 to step 309 in FIG. 3 and FIG. 4.

Figure 7:
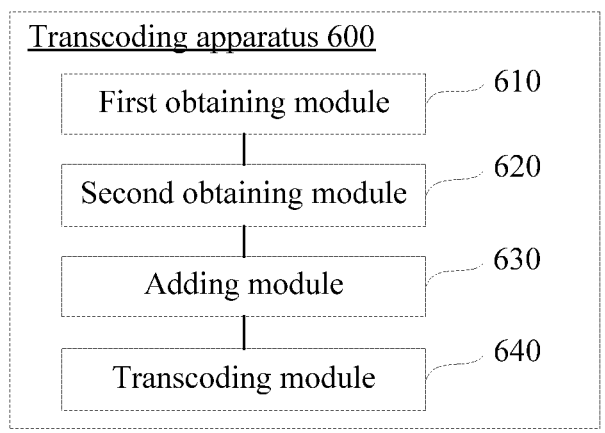
FIG. 7 is a structural block diagram of a transcoding apparatus according to an embodiment of this application.

FIG. 7 is a structural block diagram of a transcoding apparatus according to an embodiment of this application. The transcoding apparatus 600 being applied to the transcoding device 120 shown in FIG. 1 is used as an example for description. In other words, the transcoding apparatus 600 becomes all or a part of the transcoding device 120 through software, hardware, or a combination thereof. As shown in FIG. 7, the transcoding apparatus 600 includes: a first obtaining module 610, a second obtaining module 620, an adding module 630, and a transcoding module 640.

The first obtaining module 610 is configured to implement step 204 above and any other implicit or disclosed obtaining-related function.

The second obtaining module 620 is configured to implement step 205 and step 314 above, as well as any other implicit or disclosed obtaining-related function.

The adding module 630 is configured to implement step 206 above and any other implicit or disclosed adding-related function.

The transcoding module 640 is configured to implement step 207 and step 317 above, as well as any other implicit or disclosed transcoding-related function.

In some embodiments, the first obtaining module 610 includes: a first obtaining unit, a second obtaining unit, and a downloading unit.

The first obtaining unit is configured to implement step 310 above and any other implicit or disclosed obtaining-related function.

The second obtaining unit is configured to implement step 311 above and any other implicit or disclosed obtaining-related function.

The downloading unit is configured to implement step 312 above and any other implicit or disclosed downloading-related function.

In some embodiments, the transcoding apparatus 600 further includes: a movement module, a generating module, a sending module, and a third obtaining module.

The movement module is configured to implement step 318 above and any other implicit or disclosed movement-related function.

The generating module is configured to implement step 319 above and any other implicit or disclosed generating-related function.

The sending module is configured to implement step 320 above and any other implicit or disclosed sending-related function.

The third obtaining module is configured to implement step 313 above and any other implicit or disclosed obtaining-related function.

In some embodiments, the adding module 630 includes: a determining unit and an adding unit.

The determining unit is configured to implement step 315 above and any other implicit or disclosed determining-related function.

The adding unit is configured to implement step 316 above and any other implicit or disclosed adding-related function.

In conclusion, in the transcoding apparatus provided in this embodiment of this application, a segmentation device segments a video file; a transcoding configuration parameter is determined according to a customized index parameter of the video file; a transcoding device adds a customized material to a video fragment according to the transcoding configuration parameter and performs transcoding to obtain a target video fragment; a merging device merges n target video fragments belonging to the same video file into a complete target video file. Uniform management and scheduling is performed according to transcoding configuration parameters. Therefore, when transcoding a video fragment, the transcoding device can determine a customized material corresponding to the video fragment according to the transcoding configuration parameter, and determine an adding position of the customized material in the video fragment, so that processes of adding customized materials to video fragments are independent of each other. Therefore, a plurality of transcoding devices may be used to process a plurality of video fragments of the same video file concurrently, so that customization processing and transcoding of the video file can be both performed by a plurality of devices concurrently, thereby improving efficiency of customizing and transcoding the video file.

The transcoding device moves a target video fragment to a download service path, generates a second download address, and sends the second download address to the task management device. The task management device stores the second download address, and converts a task state to be a completed state, so that during subsequent distribution of transcoding tasks, the task management device does not repeatedly issue a transcoding task already completed. In addition, after n video fragments are all transcoded, the task management device generates a merging task. During merging, the merging device obtains the second download address of each target video fragment from the merging task, and obtains, according to the second download addresses, the target video fragments that need to be merged. The task management device is used for uniform scheduling and management, so that a merging task can be generated in time after all the n video fragments are transcoded, to merge the target video fragments, thereby improving the transcoding efficiency of the video file.

Specific manners in which the modules in the transcoding apparatus in the foregoing embodiment perform operations have been described in detail in the steps related to the transcoding method in the embodiments in FIG. 2 and FIG. 3, and are not described in detail herein again.

An embodiment of this application further provides a transcoding apparatus. The transcoding apparatus includes a processor and a memory. The memory stores at least one instruction that is loaded and executed by the processor to implement the transcoding method described in step 204 to step 207 in FIG. 2, and in step 310 to step 320 in FIG. 3 and FIG. 4.

In an exemplary embodiment, a computer readable storage medium is further provided. The storage medium stores at least one instruction that is loaded and executed by a processor to implement the transcoding method described in step 204 to step 207 in FIG. 2, and in step 310 to step 320 in FIG. 3 and FIG. 4.

In an exemplary embodiment, a computer program product is further provided. The program product stores at least one instruction that is loaded and executed by a processor to implement the transcoding method described in step 204 to step 207 in FIG. 2, and in step 310 to step 320 in FIG. 3 and FIG. 4.

Figure 8:
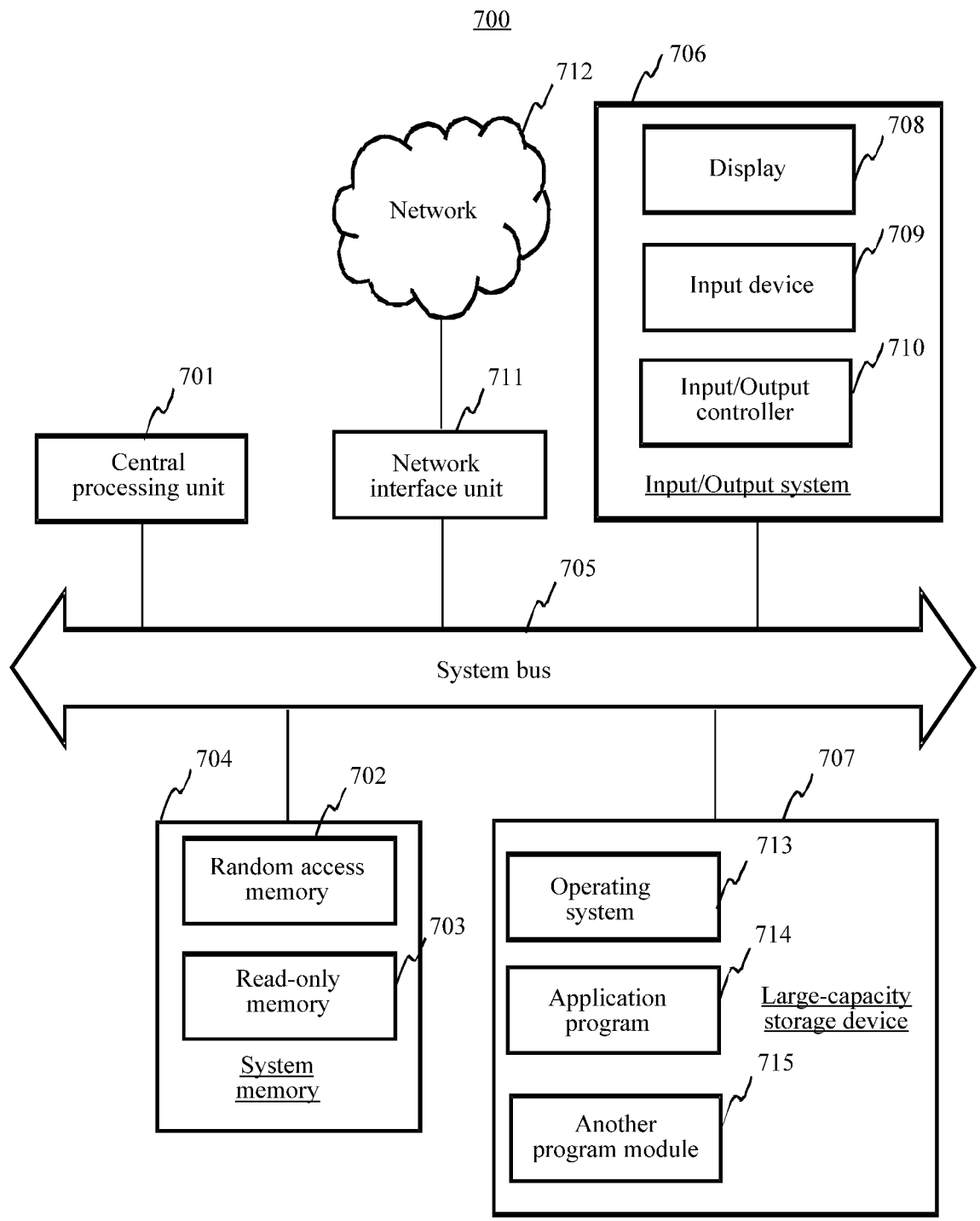
FIG. 8 is a schematic structural diagram of a server according to an embodiment of this application.

FIG. 8 is a schematic structural diagram of a server according to an embodiment of this application. The server may be the segmentation device 110, the transcoding device 120, the merging device 130, the task management device 140, the transcoding configuration device 150, the material device 160, the storage device 170, or the source file storage device 190 shown in FIG. 1. Specifically, the server 700 includes a central processing unit (CPU) 701, a system memory 704 including a random access memory (RAM) and a read-only memory (ROM) 703, and a system bus 705 connecting the system memory 704 and the CPU 701. The server 700 further includes a basic input/output system (I/O system) 706 assisting in transmission of information between devices in a computer, and a large-capacity storage device 707 configured to store an operating system 713, an application program 714, and other program modules 715.

The basic I/O system 706 includes a display 708 configured to display information, an input device 709 used by a user to input information, for example, a mouse or a keyboard. The display 708 and the input device 709 are both connected to the CPU 701 by being connected to an I/O controller 710 of the system bus 705. The basic I/O system 706 may further include the I/O controller 710 to receive and process inputs from a plurality of other devices such as a keyboard, a mouse, or an electronic stylus. Similarly, the I/O controller 710 further provides outputs to a display, a printer, or other types of output devices.

The large-capacity storage device 707 is connected to the CPU 701 by being connected to a large-capacity storage controller (not shown) of the system bus 705. The large-capacity storage device 707 and an associated computer readable medium thereof provide non-volatile storage for the server 700. In other words, the large-capacity storage device 707 may include a computer readable medium (not shown) such as a hard disk or compact disc read-only memory (CD-ROM) drive.

Without losing generality, the computer readable medium may include a computer storage medium and a communication medium. The computer readable medium includes volatile and non-volatile as well as removable and non-removable media that are implemented by using any method or technology and configured to store information such as a computer readable instruction, a data structure, a program module or other data. The computer readable medium includes a RAM, a ROM, an erasable programmable read-only memory (EPROM), an electrically erasable programmable read-only memory (EEPROM), a flash memory, or other solid-state storage technologies, a CD-ROM, a digital versatile disc (DVD) or other optical storages, a cassette, a magnetic tape, a magnetic disk storage or other magnetic storage devices. Definitely, it is known to a person skilled in the art that the computer storage medium is not limited to the foregoing types. The system memory 704 and the large-capacity storage device 707 may be collectively referred to as a memory.

According to the embodiments of this application, the server 700 may further be connected to a remote computer on a network through a network such as the Internet, and run on the remote computer. That is, the server 700 may be connected to a network 712 through a network interface unit 711 on the system bus, or connected to a network of another type or a remote computer system (not shown) through the network interface unit 711.

The serial numbers of the embodiments of this application are merely for the convenience of description, and do not imply the preference among the embodiments.

A person of ordinary skill in the art may understand that all or some of the steps of the foregoing embodiments may be implemented by using hardware, or may be implemented by a program instructing relevant hardware. The program may be stored in a computer readable storage medium. The storage medium may be a ROM, a magnetic disk, an optical disc, or the like.

The foregoing descriptions are merely preferred embodiments of this application, and are not intended to limit this application. Any modification, equivalent replacement, or improvement made within the spirit and principle of this application shall fall within the protection scope of this application.

What is claimed is:

1. A video file transcoding system, comprising: a segmentation device, a transcoding device, and a merging device,
the segmentation device being configured to obtain a video file and a customized index parameter of the video file; split the video file into n video fragments, n being a positive integer greater than 1; generate transcoding configuration parameters according to the customized index parameter, the customized index parameters being used for indicating identifiers of customized materials, and the transcoding configuration parameters being used for indicating detailed information of the customized materials and a relationship between the customized materials and the video fragments;
the transcoding device being configured to obtain an ith video fragment, the ith video fragment being any one of the n video fragments, and i being a positive integer greater than or equal to 1 and less than or equal to n; obtain a customized material corresponding to the ith video fragment according to the transcoding configuration parameters; add the obtained customized material to the ith video fragment, to obtain an ith customized video fragment; and transcode the ith customized video fragment to obtain an ith target video fragment; and
the merging device being configured to merge the n target video fragments into a target video file after the n customized video fragments are all transcoded.

2. The system according to claim 1, further comprising a task management device, wherein
the segmentation device is configured to move the n video fragments to a download service path; generate first download addresses according to the download service path, each video fragment corresponding to a respective first download address; and send identifiers of the video fragments and the first download addresses to the task management device;
the task management device is configured to generate an ith transcoding task according to an identifier of the ith video fragment, a first download address of the ith video fragment, and preset transcoding information, the transcoding information being used for indicating a transcoding bit rate corresponding to the video fragment; and
the transcoding device is configured to obtain the ith transcoding task; obtain the first download address of the ith video fragment from the transcoding task; and download the ith video fragment according to the first download address.

3. The system according to claim 2, wherein
the transcoding device is configured to move, after obtaining the ith target video fragment, the target video fragment to a download service path; generate a second download address according to the download service path; and send an identifier of the target video fragment and the second download address to the task management device, each target video fragment corresponding to a respective second download address; and
the task management device is configured to convert a task state of the ith transcoding task to be a completed state.

4. The system according to claim 3, wherein
the task management device is configured to generate a merging task according to identifiers of the n target video fragments and the n second download addresses after the n transcoding tasks are all completed, the n target video fragments in each merging task corresponding to the same bit rate;
the merging device is configured to obtain the merging task; obtain the second download addresses of the n target video fragments from the merging task; download the n target video fragments according to the second download addresses; merge the n target video fragments into the target video file according to the identifiers of the n target video fragments; and send state transition information to the task management device; and
the task management device is configured to convert a task state of the merging task to be a completed state according to the state transition information.

5. The system according to claim 1, further comprising a material device and a transcoding configuration device, wherein
the segmentation device is configured to obtain a customized detail parameter from the material device according to the customized index parameter of the video file, the customized detail parameter being used for indicating the detailed information of the customized materials; generate the transcoding configuration parameters according to the video fragments and the customized detail parameter; and store the transcoding configuration parameters into the transcoding configuration device; and
the transcoding device is configured to obtain, from the transcoding configuration device, a transcoding configuration parameter corresponding to the ith video fragment according to the ith video fragment; and obtain the customized material corresponding to the ith video fragment according to the transcoding configuration parameter.

6. The system according to claim 1, wherein
the transcoding device is configured to determine, according to a type of the obtained customized material, an adding manner corresponding to the type of the customized material; and add the customized material to the ith video fragment in the adding manner according to the transcoding configuration parameter, to obtain the ith customized video fragment.

7. A video file transcoding method performed at a video file transcoding system comprising a segmentation device, at least two transcoding devices, and a merging device, the method comprising:
  obtaining, by the segmentation device, a video file and a customized index parameter of the video file; splitting the video file into n video fragments, n being a positive integer greater than 1; generating transcoding configuration parameters according to the customized index parameter, the customized index parameters being used for indicating identifiers of customized materials, and the transcoding configuration parameters being used for indicating detailed information of the customized materials and a relationship between the customized materials and the video fragments;
  obtaining, by the transcoding device, an ith video fragment, the ith video fragment being any one of the n video fragments, and i being a positive integer greater than or equal to 1 and less than or equal to n; obtaining a customized material corresponding to the ith video fragment according to the transcoding configuration parameters; adding the obtained customized material to the ith video fragment, to obtain an ith customized video fragment; and transcoding the ith customized video fragment to obtain an ith target video fragment; and
  merging, by the merging device, the n target video fragments into a target video file after the n customized video fragments are all transcoded.

8. The method according to claim 7, further comprising:
  before obtaining, by the transcoding device, an ith video fragment:
    moving, by the segmentation device, the n video fragments to a download service path; generating first download addresses according to the download service path, each video fragment corresponding to a respective first download address; and sending identifiers of the video fragments and the first download addresses to the task management device;
    generating, by the task management device, an ith transcoding task according to an identifier of the ith video fragment, a first download address of the ith video fragment, and preset transcoding information, the transcoding information being used for indicating a transcoding bit rate corresponding to the video fragment; and
  the obtaining, by the transcoding device, an ith video fragment comprises:
  obtaining, by the transcoding device, the ith transcoding task; obtaining the first download address of the ith video fragment from the transcoding task; and downloading the ith video fragment according to the first download address.

9. The method according to claim 8, further comprising:
  after the transcoding device obtains the ith target video fragment:
    moving, by the transcoding device, the target video fragment to a download service path; generating a second download address according to the download service path, each target video fragment corresponding to a respective second download address; and sending an identifier of the target video fragment and the second download address to the task management device; and
    converting, by the task management device, a task state of the ith transcoding task to be a completed state.

10. The method according to claim 9, further comprising:
  before merging, by the merging device, the n target video fragments into a target video file:
    generating, by the task management device, a merging task according to identifiers of the n target video fragments and the n second download addresses after the n transcoding tasks are all completed, the n target video fragments in each merging task corresponding to the same bit rate;
  the merging, by the merging device, the n target video fragments into a target video file comprises:
  obtaining, by the merging device, the merging task; obtaining the second download addresses of the n target video fragments from the merging task; downloading the n target video fragments according to the second download addresses; and merging the n target video fragments into the target video file according to the identifiers of the n target video fragments; and
  after the merging, by the merging device, the n target video fragments into a target video file, the method further comprises:
  sending, by the merging device, state transition information to the task management device; and
  converting, by the task management device, a task state of the merging task to be a completed state according to the state transition information.

11. The method according to claim 7, wherein the generating, by the segmentation device, transcoding configuration parameters according to the customized index parameter comprises:
  obtaining, by the segmentation device, a customized detail parameter from the material device according to the customized index parameter of the video file, the customized detail parameter being used for indicating the detailed information of the customized materials; generating the transcoding configuration parameters according to the video fragments and the customized detail parameter; and storing the transcoding configuration parameters into the transcoding configuration device; and
  the obtaining, by the transcoding device, a customized material corresponding to the ith video fragment according to the transcoding configuration parameters comprises:
  obtaining, by the transcoding device from the transcoding configuration device, a transcoding configuration parameter corresponding to the ith video fragment according to the ith video fragment; and obtaining the customized material corresponding to the ith video fragment according to the transcoding configuration parameter.

12. The method according to claim 7, wherein the adding, by the transcoding device, the obtained customized material to the ith video fragment, to obtain an ith customized video fragment comprises:
  determining, by the transcoding device according to a type of the obtained customized material, an adding manner corresponding to the type of the customized material; and adding the customized material to the ith video fragment in the adding manner according to the transcoding configuration parameter, to obtain the ith customized video fragment.

13. One or more non-transitory computer readable storage mediums storing a plurality of machine readable instructions in connection with a video file transcoding system including a segmentation device, a transcoding device, and a merging device, wherein the plurality of machine readable instructions, when executed by the video file transcoding system, cause the video file transcoding system to perform a plurality of operations including:

obtaining, by the segmentation device, a video file and a customized index parameter of the video file; splitting the video file into n video fragments, n being a positive integer greater than 1; generating transcoding configuration parameters according to the customized index parameter, the customized index parameters being used for indicating identifiers of customized materials, and the transcoding configuration parameters being used for indicating detailed information of the customized materials and a relationship between the customized materials and the video fragments;

obtaining, by the transcoding device, an ith video fragment, the ith video fragment being any one of the n video fragments, and i being a positive integer greater than or equal to 1 and less than or equal to n; obtaining a customized material corresponding to the ith video fragment according to the transcoding configuration parameters; adding the obtained customized material to the ith video fragment, to obtain an ith customized video fragment; and transcoding the ith customized video fragment to obtain an ith target video fragment; and merging, by the merging device, the n target video fragments into a target video file after the n customized video fragments are all transcoded.

14. The storage mediums according to claim 13, wherein the plurality of operations further comprise:

before obtaining, by the transcoding device, an ith video fragment:

moving, by the segmentation device, the n video fragments to a download service path; generating first download addresses according to the download service path, each video fragment corresponding to a respective first download address; and sending identifiers of the video fragments and the first download addresses to the task management device;

generating, by the task management device, an ith transcoding task according to an identifier of the ith video fragment, a first download address of the ith video fragment, and preset transcoding information, the transcoding information being used for indicating a transcoding bit rate corresponding to the video fragment; and the obtaining, by the transcoding device, an ith video fragment comprises:

obtaining, by the transcoding device, the ith transcoding task; obtaining the first download address of the ith video fragment from the transcoding task; and downloading the ith video fragment according to the first download address.

15. The storage mediums according to claim 14, wherein the plurality of operations further comprise:

after the transcoding device obtains the ith target video fragment:

moving, by the transcoding device, the target video fragment to a download service path; generating a second download address according to the download service path, each target video fragment corresponding to a respective second download address; and sending an identifier of the target video fragment and the second download address to the task management device; and converting, by the task management device, a task state of the ith transcoding task to be a completed state.

16. The storage mediums according to claim 15, wherein the plurality of operations further comprise:

before merging, by the merging device, the n target video fragments into a target video file:

generating, by the task management device, a merging task according to identifiers of the n target video fragments and the n second download addresses after the n transcoding tasks are all completed, the n target video fragments in each merging task corresponding to the same bit rate;

the merging, by the merging device, the n target video fragments into a target video file comprises:

obtaining, by the merging device, the merging task; obtaining the second download addresses of the n target video fragments from the merging task; downloading the n target video fragments according to the second download addresses; and merging the n target video fragments into the target video file according to the identifiers of the n target video fragments; and after the merging, by the merging device, the n target video fragments into a target video file, the method further comprises:

sending, by the merging device, state transition information to the task management device; and converting, by the task management device, a task state of the merging task to be a completed state according to the state transition information.

17. The storage mediums according to claim 13, wherein the generating, by the segmentation device, transcoding configuration parameters according to the customized index parameter comprises:

obtaining, by the segmentation device, a customized detail parameter from the material device according to the customized index parameter of the video file, the customized detail parameter being used for indicating the detailed information of the customized materials; generating the transcoding configuration parameters according to the video fragments and the customized detail parameter; and storing the transcoding configuration parameters into the transcoding configuration device; and the obtaining, by the transcoding device, a customized material corresponding to the ith video fragment according to the transcoding configuration parameters comprises:

obtaining, by the transcoding device from the transcoding configuration device, a transcoding configuration parameter corresponding to the ith video fragment according to the ith video fragment; and obtaining the customized material corresponding to the ith video fragment according to the transcoding configuration parameter.

18. The storage mediums according to claim 13, wherein the adding, by the transcoding device, the obtained customized material to the ith video fragment, to obtain an ith customized video fragment comprises:

determining, by the transcoding device according to a type of the obtained customized material, an adding manner corresponding to the type of the customized material; and adding the customized material to the ith video fragment in the adding manner according to the transcoding configuration parameter, to obtain the ith customized video fragment.

* * * * *